(12) United States Patent
van der Weide

(10) Patent No.: US 10,401,389 B2
(45) Date of Patent: Sep. 3, 2019

(54) ORTHOGONAL FIELD PROBES

(71) Applicant: vdW Design, LLC, Madison, WI (US)

(72) Inventor: Daniel Warren van der Weide, Madison, WI (US)

(73) Assignee: vdW Design, LLC, Madison, WI (US)

(*) Notice: Subject to any disclaimer, the term of this patent is extended or adjusted under 35 U.S.C. 154(b) by 284 days.

(21) Appl. No.: 15/423,191

(22) Filed: Feb. 2, 2017

(65) Prior Publication Data

US 2017/0219630 A1    Aug. 3, 2017

Related U.S. Application Data

(60) Provisional application No. 62/290,271, filed on Feb. 2, 2016.

(51) Int. Cl.
| | | |
|---|---|---|
| *G01R 1/24* | (2006.01) | |
| *G01R 1/067* | (2006.01) | |
| *H01P 3/06* | (2006.01) | |
| *H01P 1/24* | (2006.01) | |

(52) U.S. Cl.
CPC ............. *G01R 1/24* (2013.01); *G01R 1/067* (2013.01); *H01P 1/24* (2013.01); *H01P 3/06* (2013.01)

(58) Field of Classification Search
CPC ........ G02B 13/006; G02B 13/06; G02B 9/64; G02B 13/0045; G02B 9/00; G02B 13/00

USPC ................ 324/755.02, 755.01, 537, 500
See application file for complete search history.

(56) References Cited

U.S. PATENT DOCUMENTS

| | | | | |
|---|---|---|---|---|
| 3,858,159 A | * | 12/1974 | Worth | H01R 12/675 439/399 |
| 5,936,237 A | | 8/1999 | van der Weide | |
| 6,392,317 B1 | * | 5/2002 | Hall | E21B 17/003 174/47 |
| 8,266,718 B2 | | 9/2012 | Lai et al. | |
| 2006/0178047 A1 | * | 8/2006 | Croan | H01R 13/6272 439/578 |
| 2016/0178714 A1 | * | 6/2016 | Fautz | G01R 33/483 324/309 |
| 2017/0319097 A1 | * | 11/2017 | Amthor | A61B 5/055 |
| 2018/0024214 A1 | * | 1/2018 | Bhat | G01R 33/4828 324/309 |

FOREIGN PATENT DOCUMENTS

WO    WO 2006/017249    2/2006

* cited by examiner

*Primary Examiner* — Giovanni Astacio-Oquendo
(74) *Attorney, Agent, or Firm* — Casimir Jones SC; David W. Staple

(57) ABSTRACT

Provided herein are electric and magnetic field probes for measuring and mapping distributions of such fields on, for example, circuits, antennas and materials.

20 Claims, 39 Drawing Sheets

FIG. 14A
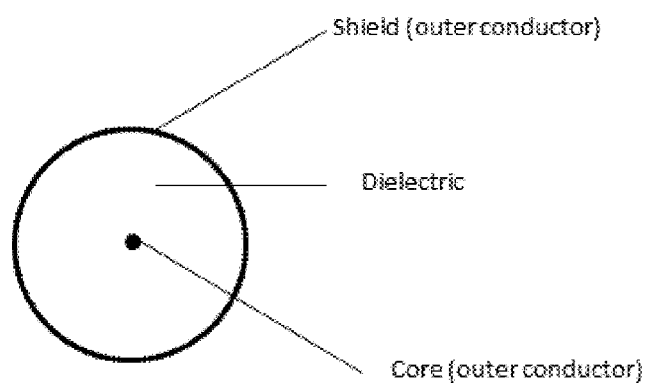
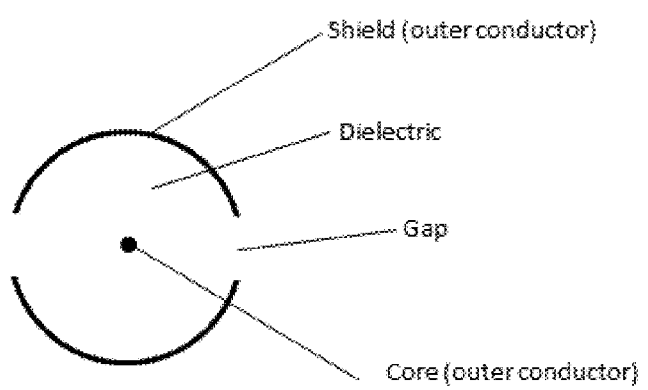
FIG. 14B

ORTHOGONAL FIELD PROBES

CROSS REFERENCE TO RELATED APPLICATIONS

The present invention claims the priority benefit of U.S. Provisional Patent Application 62/290,271, filed Feb. 2, 2016, which is incorporated by reference in its entirety.

FIELD

Provided herein are electric and magnetic field probes for measuring and mapping distributions of such fields on, for example, circuits, antennas and materials.

BACKGROUND

Detecting voltages and currents, e.g. using an oscilloscope probe, is a common practice for diagnosing circuits. Exciting these quantities with voltage, current, or power sources via ports or wafer probes is also common practice, both at low frequencies even more so at high frequencies, particularly microwave, millimeter-wave and terahertz regimes.

Particularly as frequencies increase and dimensions of circuitry decrease, the need to spatially and temporally resolve voltages and currents becomes more challenging as conductor sizes become too small for conventional probes. Likewise, the electric and magnetic fields surrounding these conductors become increasingly important to understand; there are many circuits in which fields exist between conductors, and whose spatial distribution becomes important to understand.

Field probes, such as coaxial tips, are sensitive to (or by reciprocity, can excite) primarily one component of a full three-dimensional field distribution. While useful, this information is incomplete: ideally a full three-dimensional resolution of electric and magnetic fields could be mapped in space.

SUMMARY

Provided herein are electric and magnetic field probes for measuring and mapping distributions of such fields on, for example, circuits, antennas and materials.

In some embodiments, provided herein are devices comprising a coaxial transmission line comprising: (a) a core conductor forming a longitudinal axis of the coaxial transmission line; (b) a split shield comprising two or more electrodes disposed about the longitudinal axis with gaps separating the electrodes from one another; and (c) a dielectric insulator separating the split shield from the core conductor. In some embodiments, a distal end of the coaxial transmission line terminates in an open circuit. In some embodiments, a distal end of the coaxial transmission line terminates in a short-circuited current loop (indicated by the principle of duality). In some embodiments, a distal end of the coaxial transmission line terminates in a ground plate that extends beyond the outer edge of the distal end of the split shield, and wherein the gaps of the split shield extend into and through the ground plate. In some embodiments, the coaxial transmission line is a semi-rigid coaxial transmission line. In some embodiments, the split shield is parallel to the longitudinal axis. In some embodiments, the split shield is tapered from a proximal end to a distal end about the longitudinal axis. In some embodiments, the taper angle between the split shield and the longitudinal axis is greater than 0° (parallel to the longitudinal axis) and less than 90° (perpendicular to the longitudinal axis). In some embodiments, the taper angle between the split shield and the longitudinal axis is between 10° and 80° (e.g., 10°, 15, 20, 25, 30, 35, 40, 45, 50, 55, 60, 65, 70, 75, 80, or ranges therebetween (e.g., 20-60°). In some embodiments, the split shield comprises 2-12 electrodes and gaps (e.g., 2, 3, 4, 5, 6, 7, 8, 9, 10, 11, 12, and ranges therebetween (e.g., 2-6 gaps and electrodes). In some embodiments, the split shield comprises a circular cross-section around the longitudinal axis. In some embodiments, the split shield comprises a polygonal cross-section around the longitudinal axis. In some embodiments, the split shield comprises a polygonal cross-section with 3-12 sides (e.g. 3, 4, 5, 6, 7, 8, 9, 10, 11, 12, and ranges therebetween (e.g., 3-8 sides). In some embodiments, the electrodes are disposed on sides of the polygonal cross-section with corners of the polygon occurring in the gaps. In some embodiments, the electrodes are disposed on corners of the polygonal cross-section with gaps occurring in sides of the polygon. In some embodiments, the electrodes are disposed equidistantly from the longitudinal axis. In some embodiments, the electrodes are disposed symmetrically around the longitudinal axis. In some embodiments, the gaps are 1 μm to 10 mm in width (e.g., 1 μm, 2 μm, 5 μm, 10 μm, 20 μm, 50 μm, 100 μm, 200 μm, 500 μm, 1 mm, 2 mm, 5 mm, 10 mm, and ranges therebetween). In some embodiments, the gaps are of equal widths. In some embodiments, the gaps are 50% the width of the width of the electrodes, or less (e.g., 50%, 45%, 40%, 35%, 30%, 25%, 20%, 15%, 10%, 5%, 1%). In some embodiments, narrower gaps size results in decreased sensitivity, less perturbation of a field that the device is inserted into, and more separation of field components.

In some embodiments, provided herein are devices comprising a coaxial transmission line having a proximal end, a distal end and a longitudinal axis, comprising: (a) a core conductor forming the longitudinal axis of the coaxial transmission line; (b) a split shield, tapered from the proximal end to the distal end about the longitudinal axis, with a cross-sectional geometry centered upon the longitudinal axis, and comprising two or more electrodes disposed about the longitudinal axis with gaps separating the electrodes from one another; and (c) a dielectric insulator separating the split shield from the core conductor, wherein a distal end of the coaxial transmission line terminates in an open circuit.

In some embodiments, provided herein are orthogonal field probes comprising a base and sides which taper from the base to a top vertex, the probe having electrodes arranged around the sides, the probe having a central axis comprising a tapered coaxial transmission line, wherein a distal tip of the tapered coaxial transmission line protrudes through an aperture at the top vertex. In some embodiments, the electrodes are positioned symmetrically around the sides of probe, but not extending all the way to the vertex. In some embodiments, the coaxial transmission line is shielded. In some embodiments, shielding of the coaxial transmission line is formed within the probe. In some embodiments, shielding of the coaxial transmission line is accomplished by the electrodes. In some embodiments, the base is a 3-12 sided polygon (e.g., 3, 4, 5, 6, 7, 8, 9, 10, 11, 12, or ranges therebetween), the probe has an equivalent number of sides (e.g., 3-12 (e.g., 3, 4, 5, 6, 7, 8, 9, 10, 11, 12, or ranges therebetween)), and the probe shape is pyramidal. In some embodiments, the base is circular and the probe shape is conical.

In some embodiments, provided herein are methods for measuring and/or mapping distributions electric and/or magnetic fields comprising employing the devices and/or orthogonal field probes described herein.

In some embodiments, provided herein is the use of the devices and/or orthogonal field probe described herein for measuring and/or mapping distributions electric and/or magnetic fields.

BRIEF DESCRIPTION OF THE DRAWINGS

FIG. 14A-B shows schematic cross-sectional views of (A) a traditional coaxial transmission line and (B) an exemplary embodiment of the invention in which the coaxial transmission line comprises a split shield having gaps that are useful in sensing an orthogonal electric and/or magnetic field.

DEFINITIONS

Figure 1:
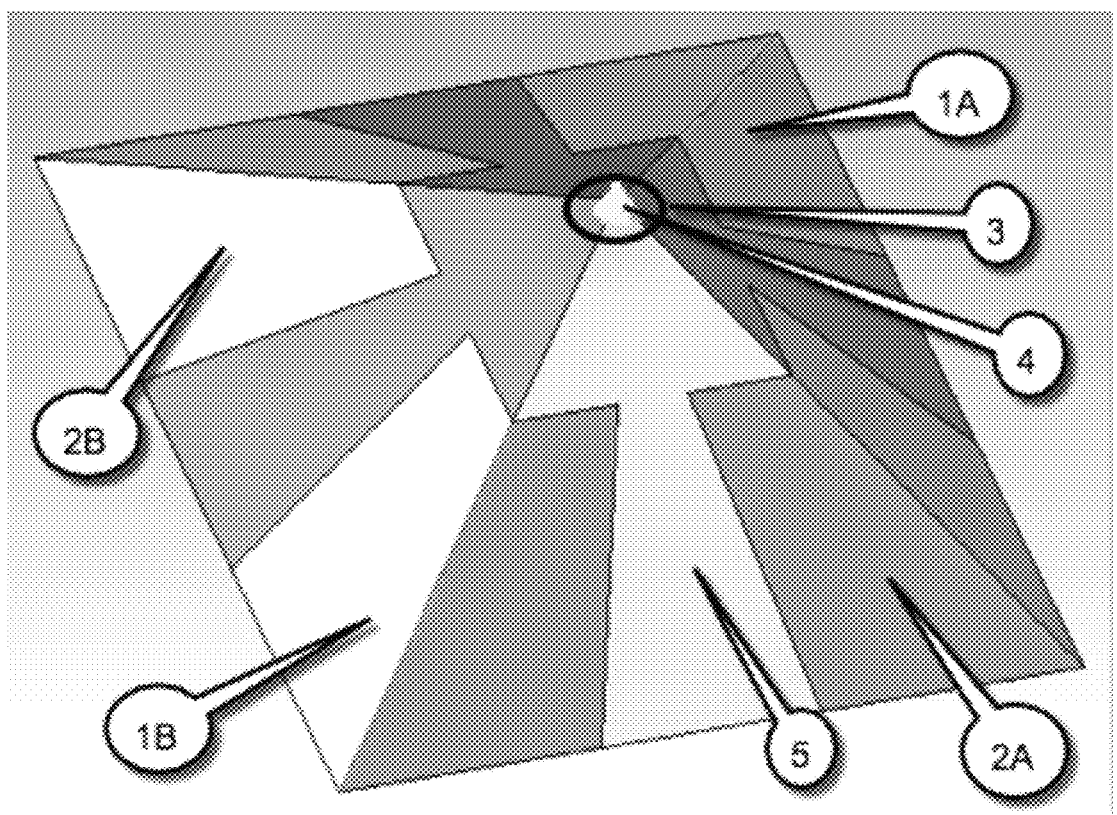
FIG. 1 depicts a plan view of an exemplary probe of the current invention. The structure is a 4-sided dielectric pyramid 5 or substantially equivalent geometry (e.g. conical or quasi-planar) having electrodes 1A, 2A, 1B and 2B arranged around it, the electrodes preferably wrapped symmetrically around the edges of dielectric pyramid 5, but not extending all the way to its tip. Within the central axis of the dielectric pyramid 5 is a tapered coaxial transmission line, whose distal tip 4 protrudes through an aperture 3. The shield of the coaxial transmission line is formed within the pyramid, or in some cases, can be comprised of electrodes 1A, 2A, 1B and 2B.
Figure 2:
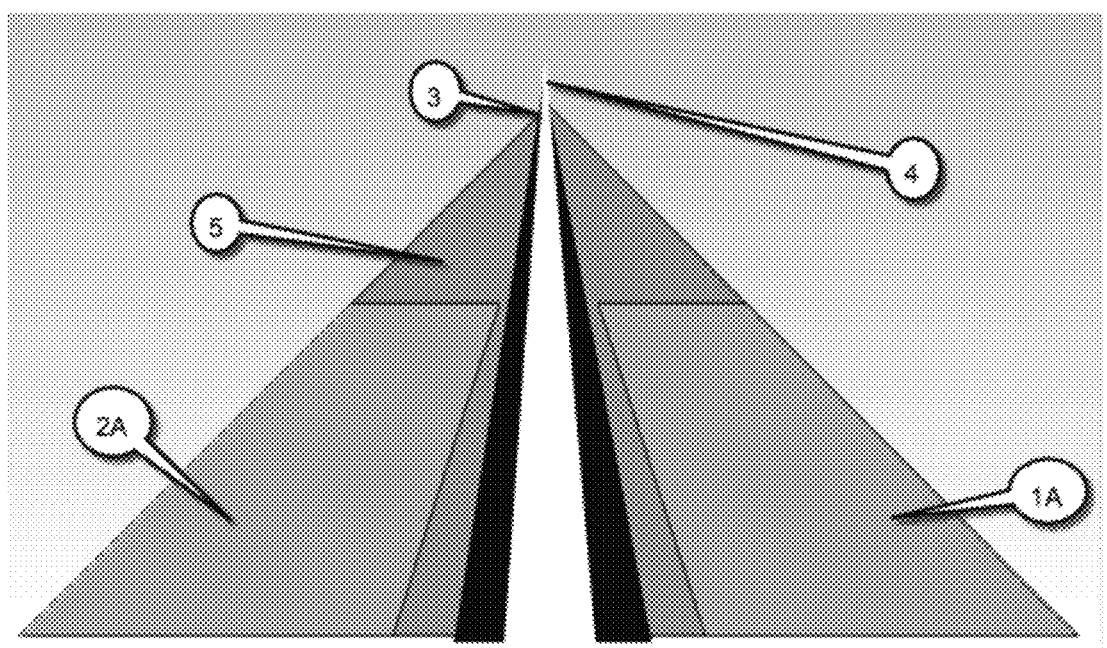
FIG. 2 depicts a side cutaway view of a probe of the current invention, with the cutaway revealing the essential coaxial structure along the interior of the pyramid central axis.
Figure 3:
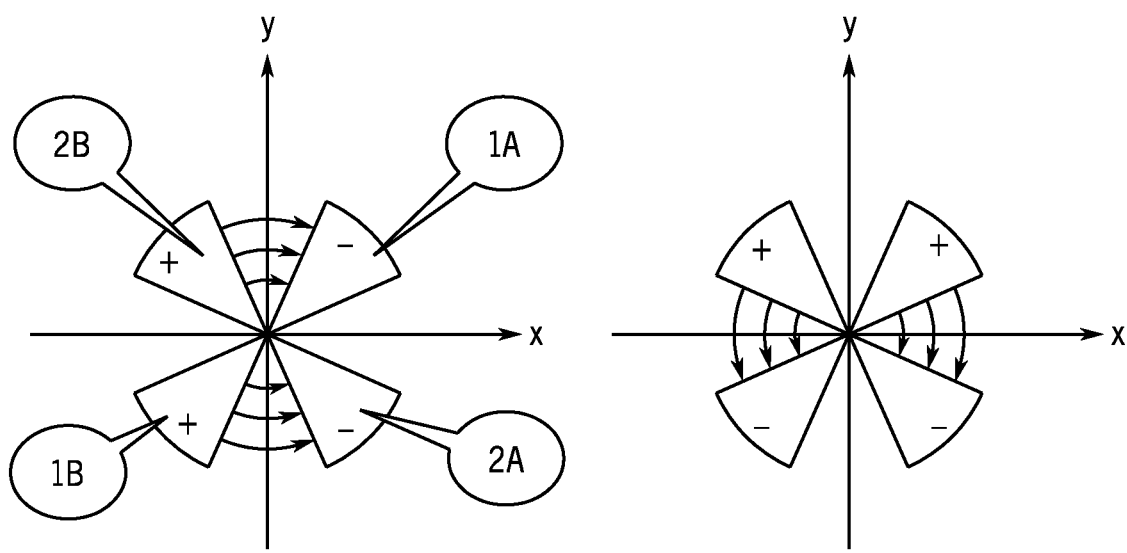
FIG. 3 depicts an operational illustration of the in-plane electrodes. The structure is shown in plain view from the top of the pyramid with electrodes 1A, 2A, 1B and 2B arranged around it, with Cartesian coordinates x and y given for reference. Depending on the phase of the differential signals driving ports 1 and 2, an in-plane electric field is created with the orientation shown. By reciprocity, depending on the phase of the receiver connected to ports 1 and 2, it will be sensitive to the orientation of the electric fields shown.
Figure 4:
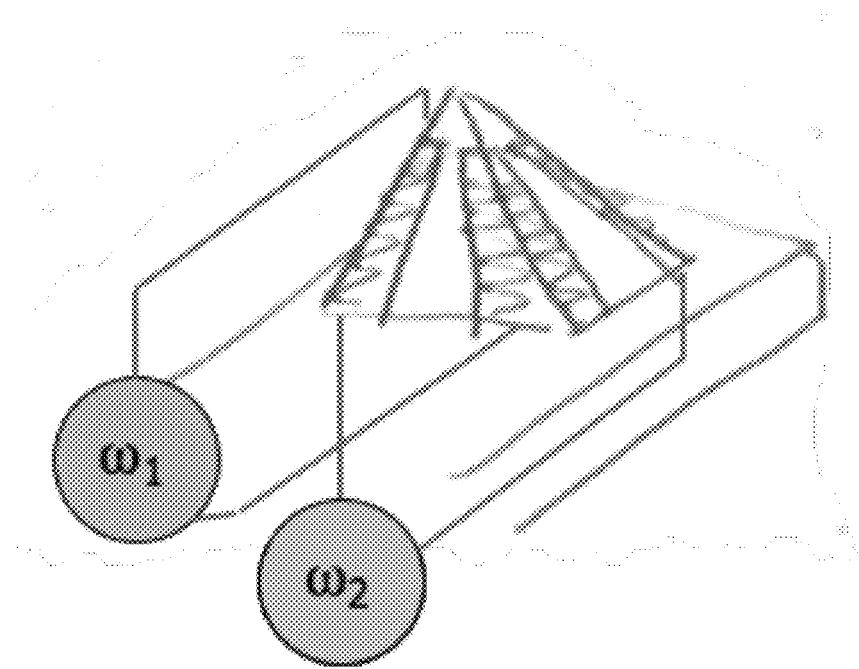
FIG. 4 depicts how the in-plane electrodes can be excited by two frequency sources. The two sources ω1 and ω2 drive electrodes 1A, 2A, 1B and 2B as shown (with the pyramidal probe tip illustrated at the distal end of a scanning probe cantilever). The phase difference between these two sources is due to the difference frequency between them |ω1−ω2|, which enables continuous variation of the phase and hence the field orientation. More complex bi-phase encoded drive signals can be used with corresponding synchronous detection both to increase signal-to-noise ratio and to determine absolute field orientations.
Figure 5A:
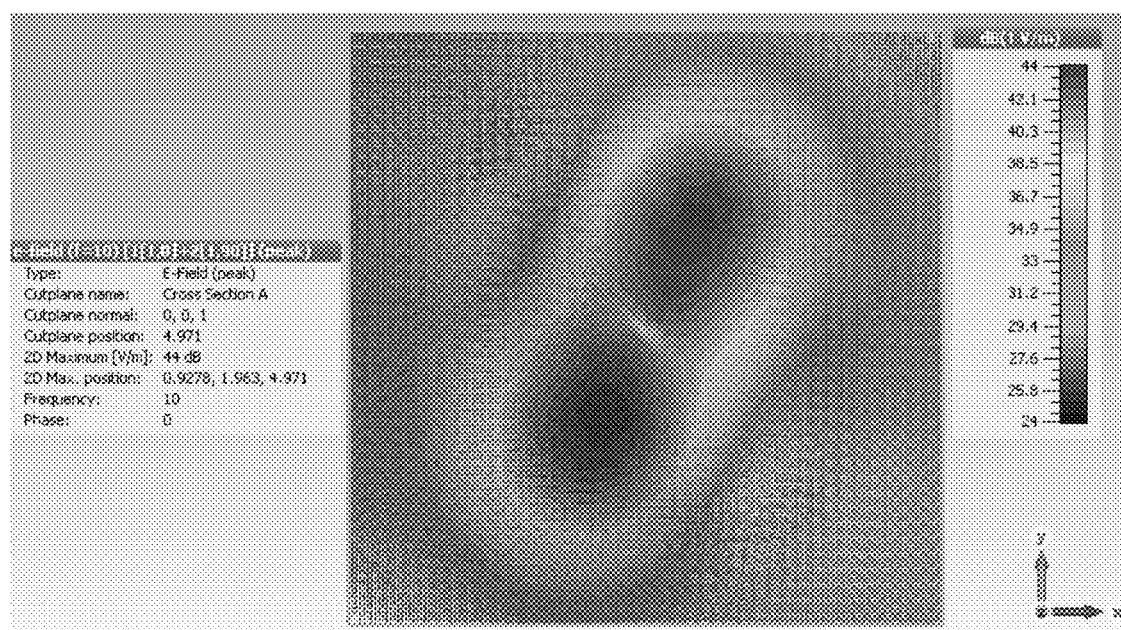
FIG. 5A-N shows probe tip simulations: (A) E-Field normal to the apex at apex (90° phase offset between ports 1 and 2 of probe tip); (B) E-Field normal to the apex at apex (0° phase offset between ports 1 and 2 of probe tip); (C) E-Field normal to the apex at Z=5 mm (90° phase offset between ports 1 and 2 of probe tip); (D) E-Field normal to the apex at Z=5 mm (0° phase offset between ports 1 and 2 of probe tip); (E) E-Field normal to the apex at Z=6 mm (90° phase offset between ports 1 and 2 of probe tip); (F) E-Field normal to the apex at Z=6 mm (0° phase offset between ports 1 and 2 of probe tip); (G) E-Field normal to the apex at Z=7 mm (90° phase offset between ports 1 and 2 of probe tip); (H) E-Field normal to the apex at Z=7 mm (0° phase offset between ports 1 and 2 of probe tip); (I) E-Field normal to the apex at Z=8 mm (90° phase offset between ports 1 and 2 of probe tip); (J) E-Field normal to the apex at Z=8 mm (0° phase offset between ports 1 and 2 of probe tip); (K) E-Field normal to the apex at Z=9 mm (90° phase offset between ports 1 and 2 of probe tip); (L) E-Field normal to the apex at Z=9 mm (0° phase offset between ports 1 and 2 of probe tip); (M) E-Field normal to the apex at Z=10 mm (90° phase offset between ports 1 and 2 of probe tip); and (N) E-Field normal to the apex at Z=10 mm (0° phase offset between ports 1 and 2 of probe tip).
Figure 5B:
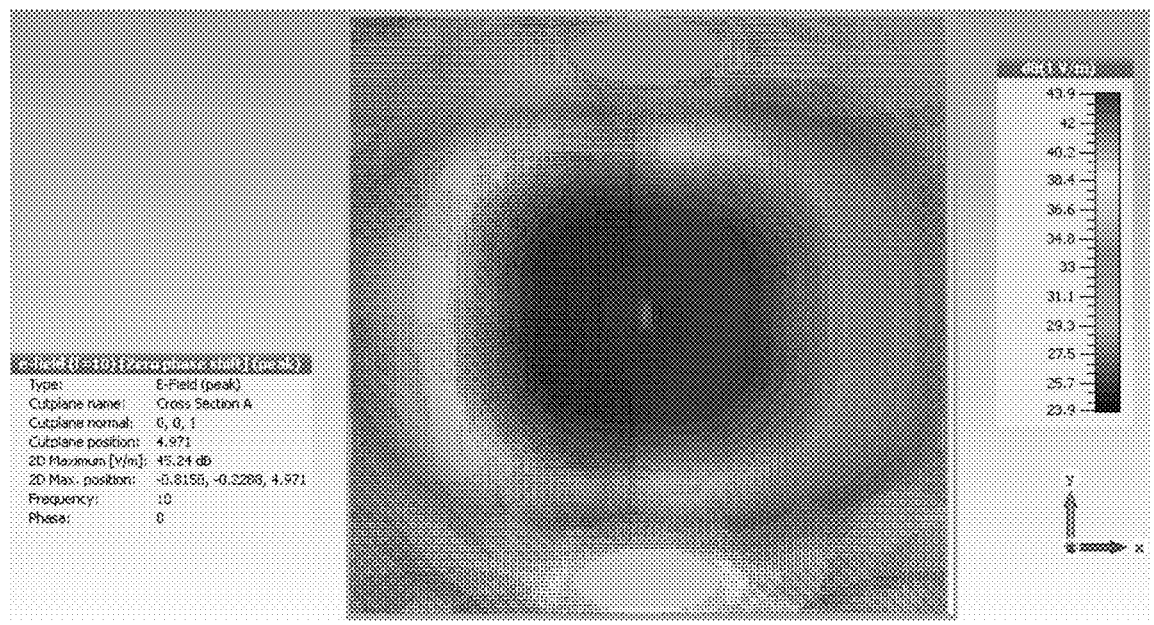
Figure 5C:
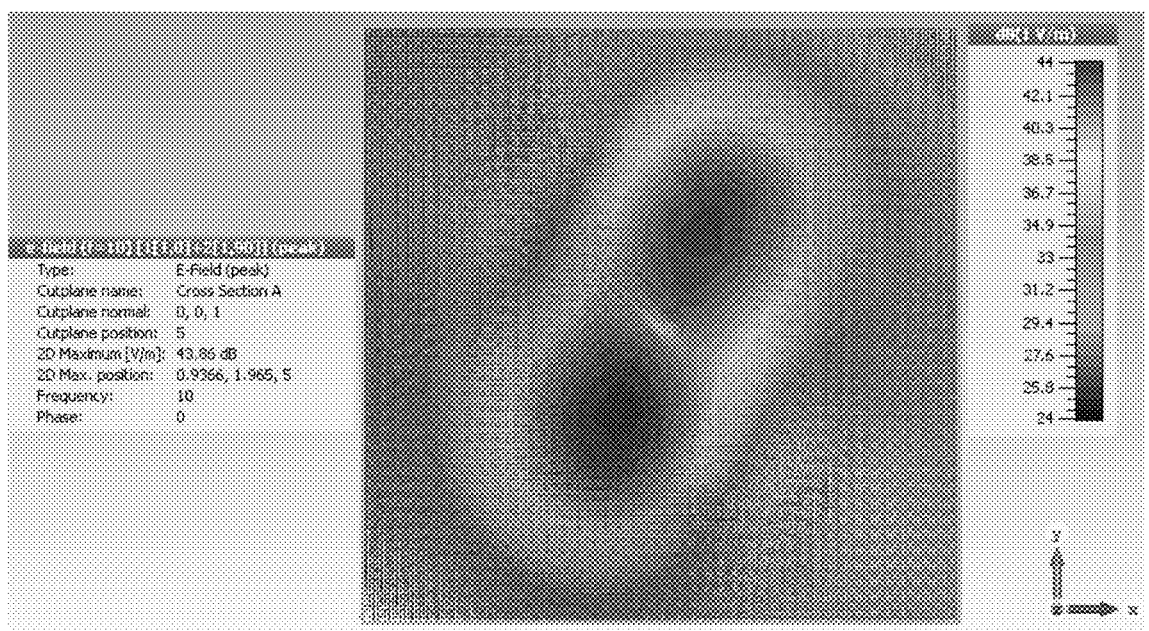
Figure 5D:
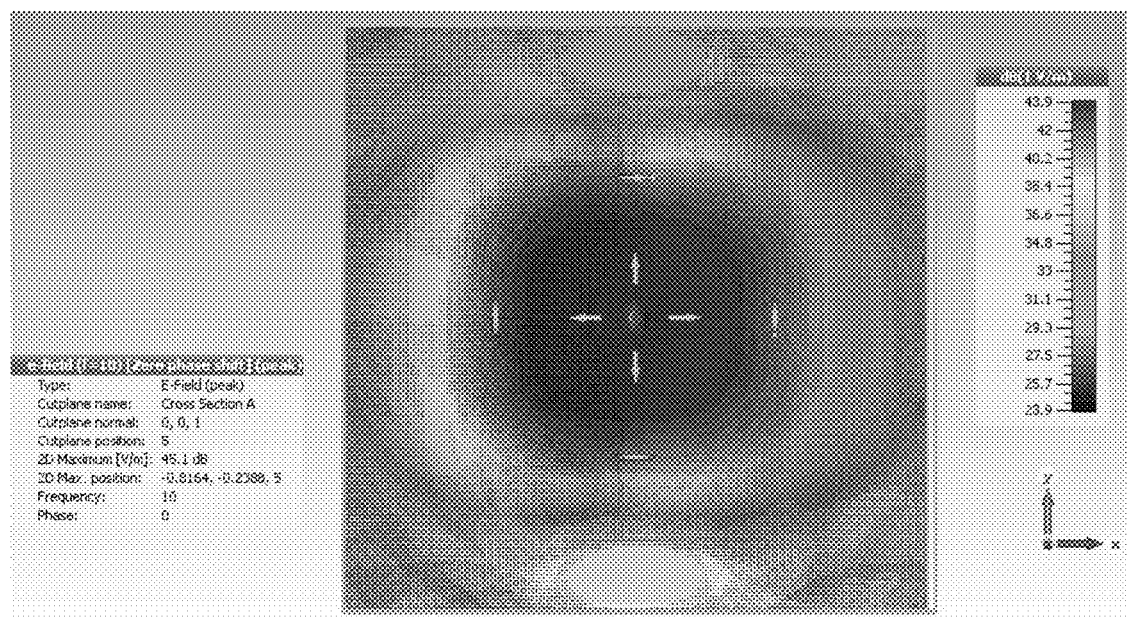
Figure 5E:
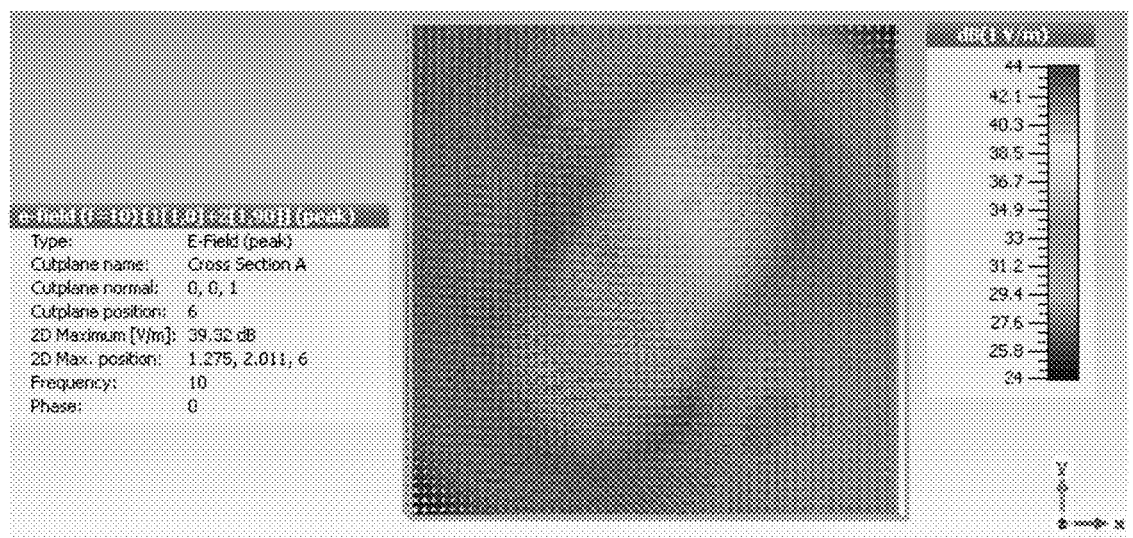
Figure 5F:
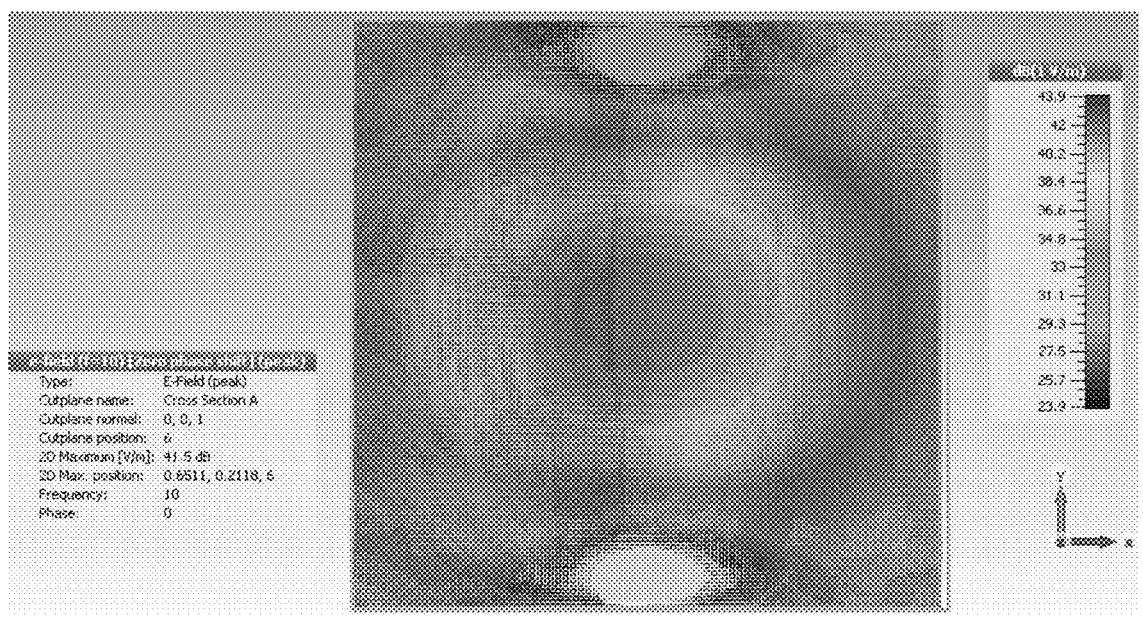
Figure 5G:
Figure 5H:
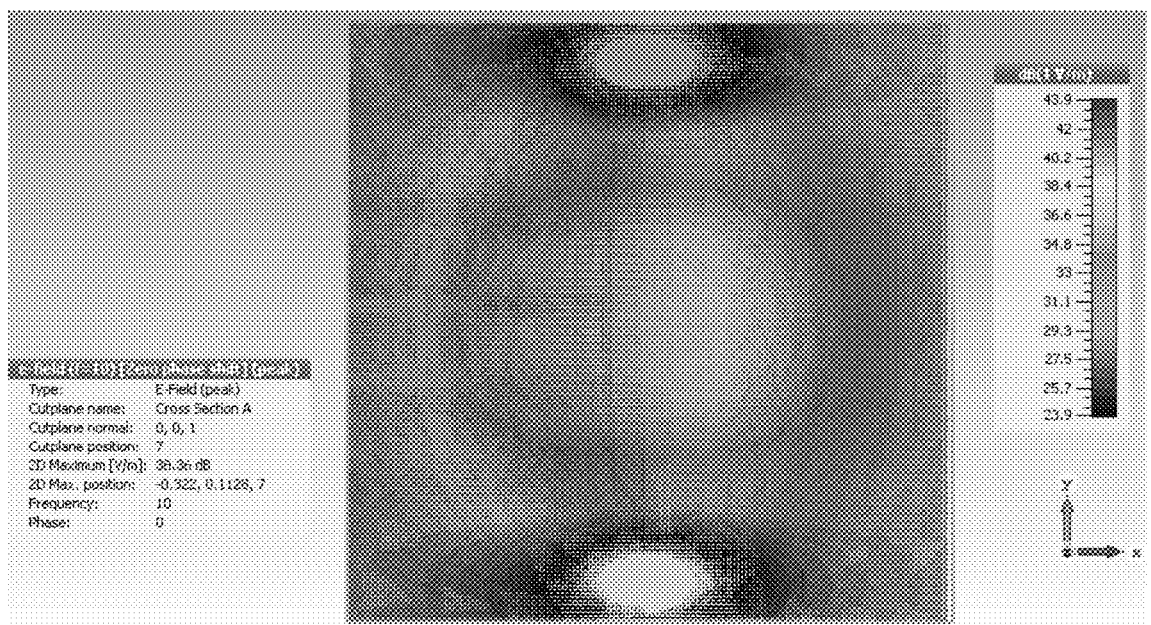
Figure 5I:
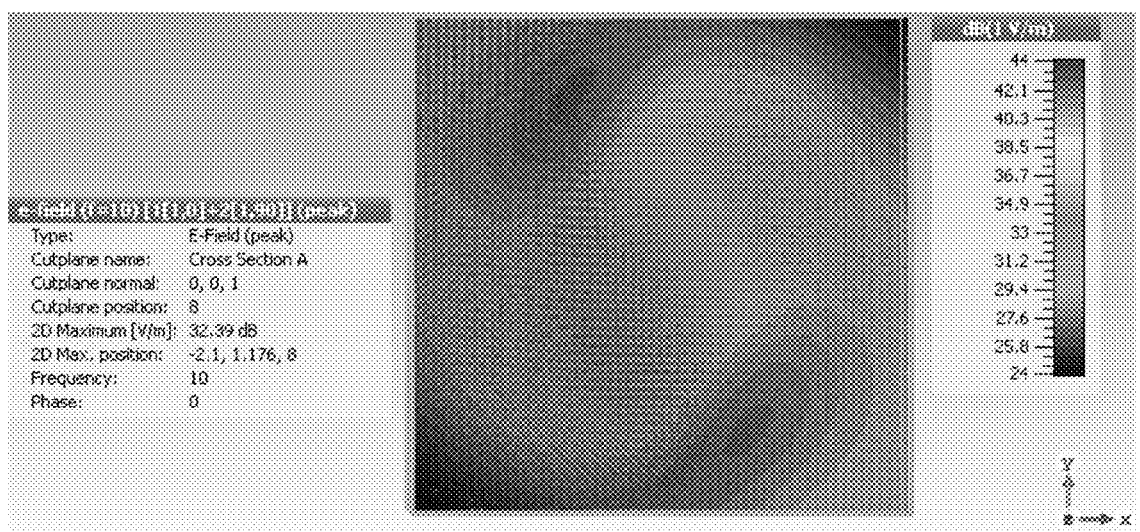
Figure 5J:
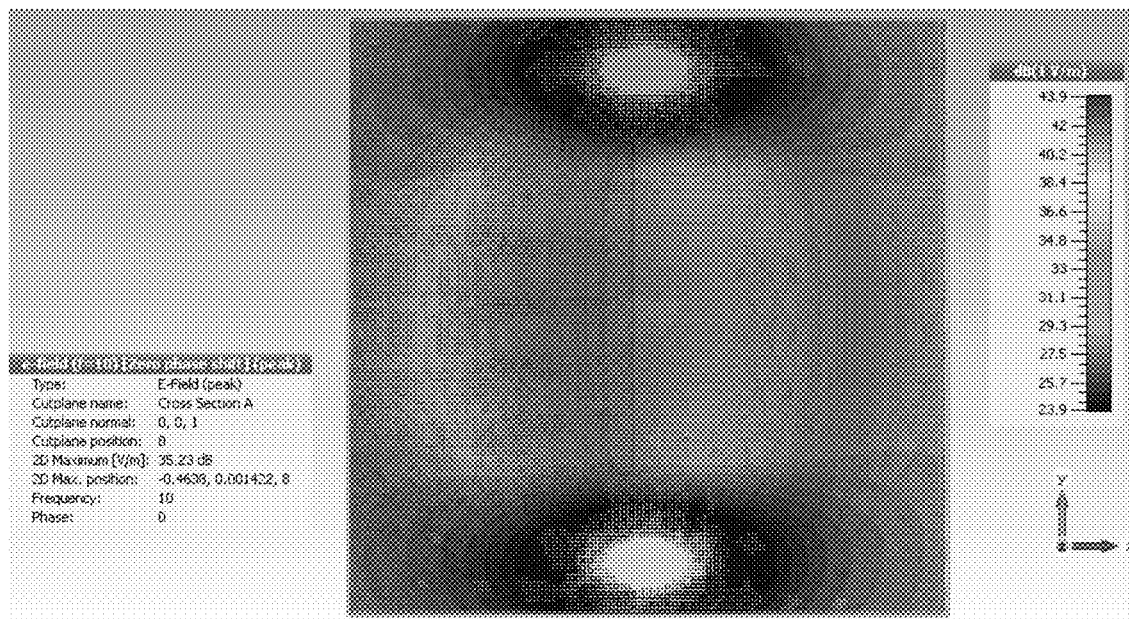
Figure 5K:
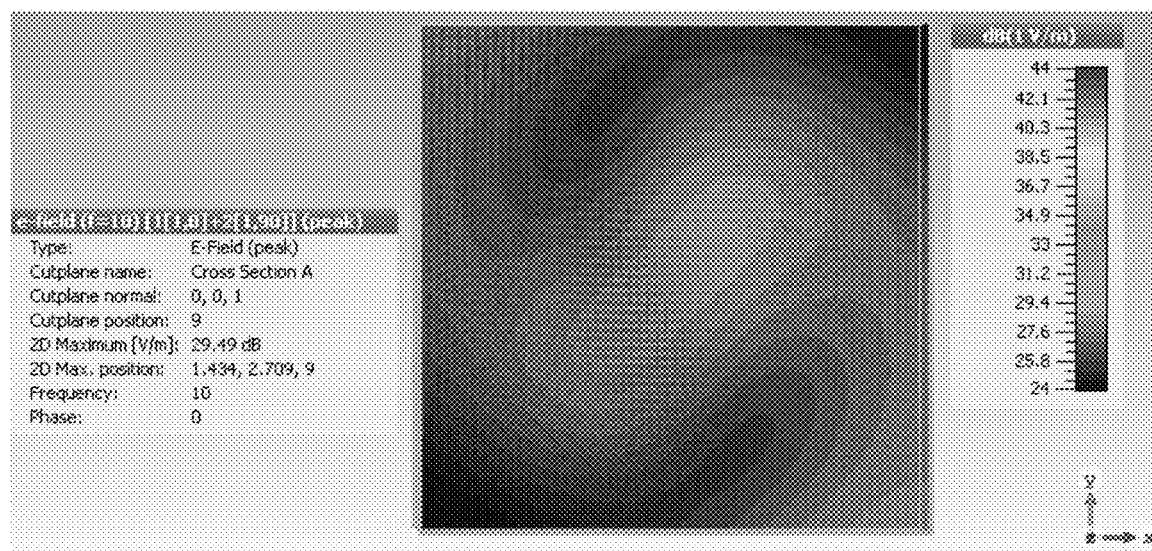
Figure 5L:
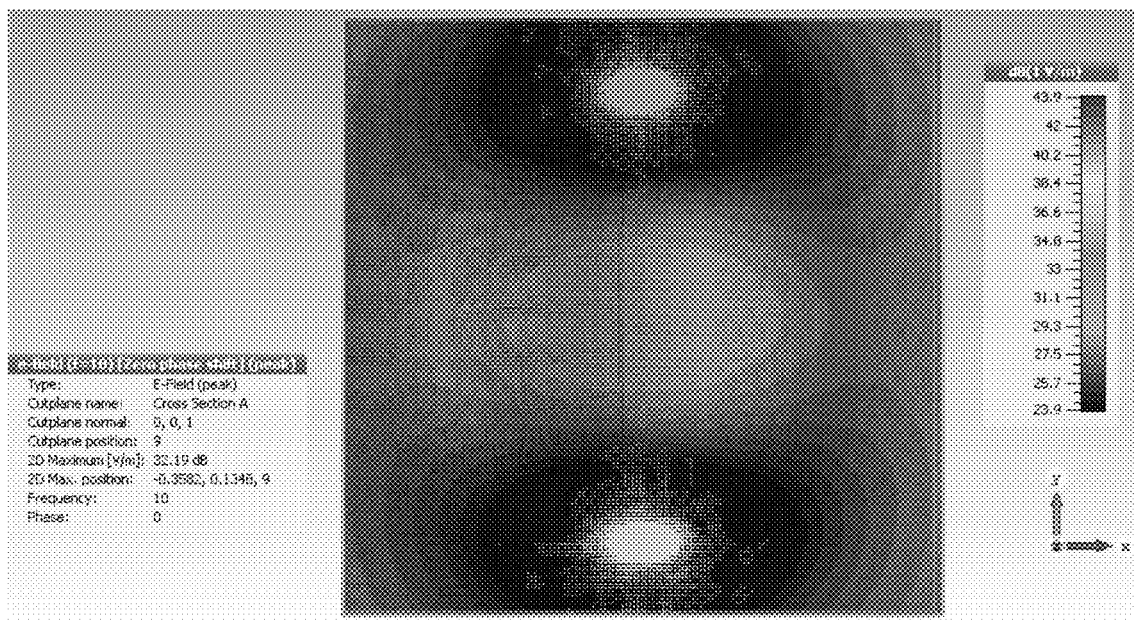
Figure 5M:
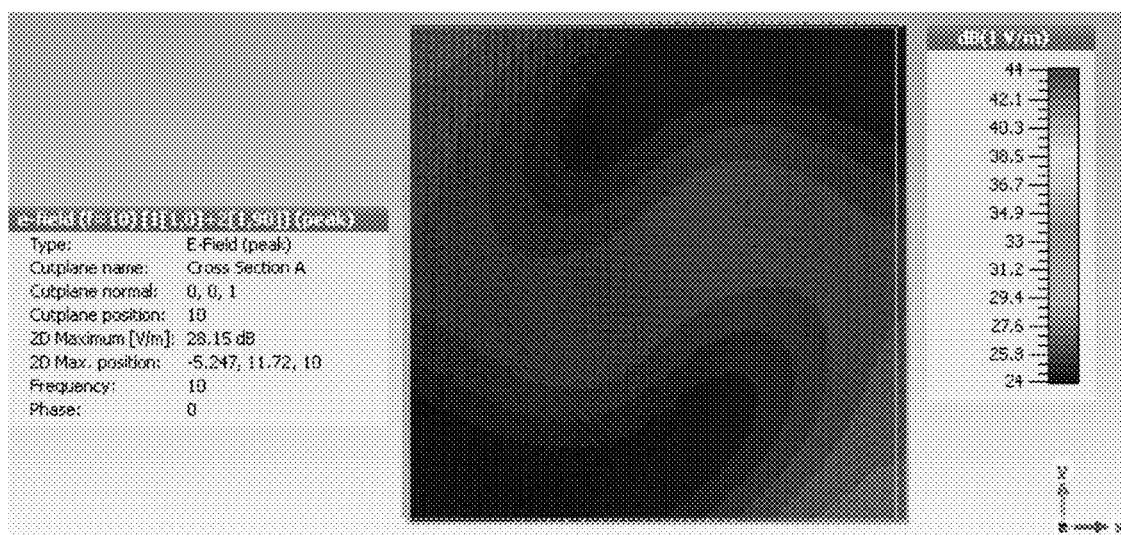
Figure 5N:
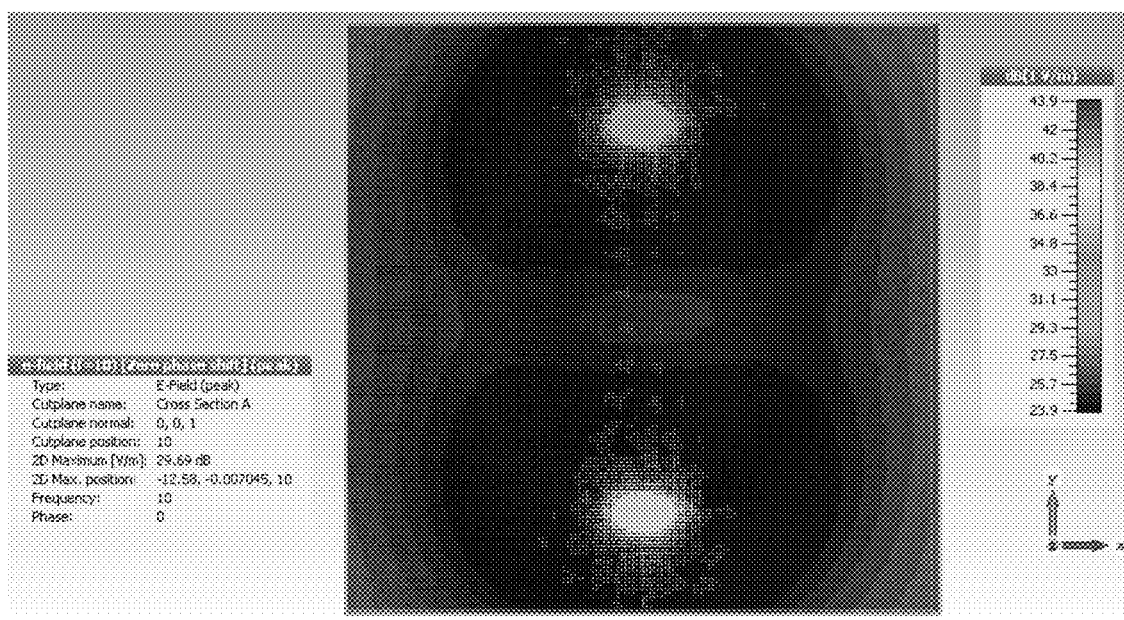
Figure 6A:
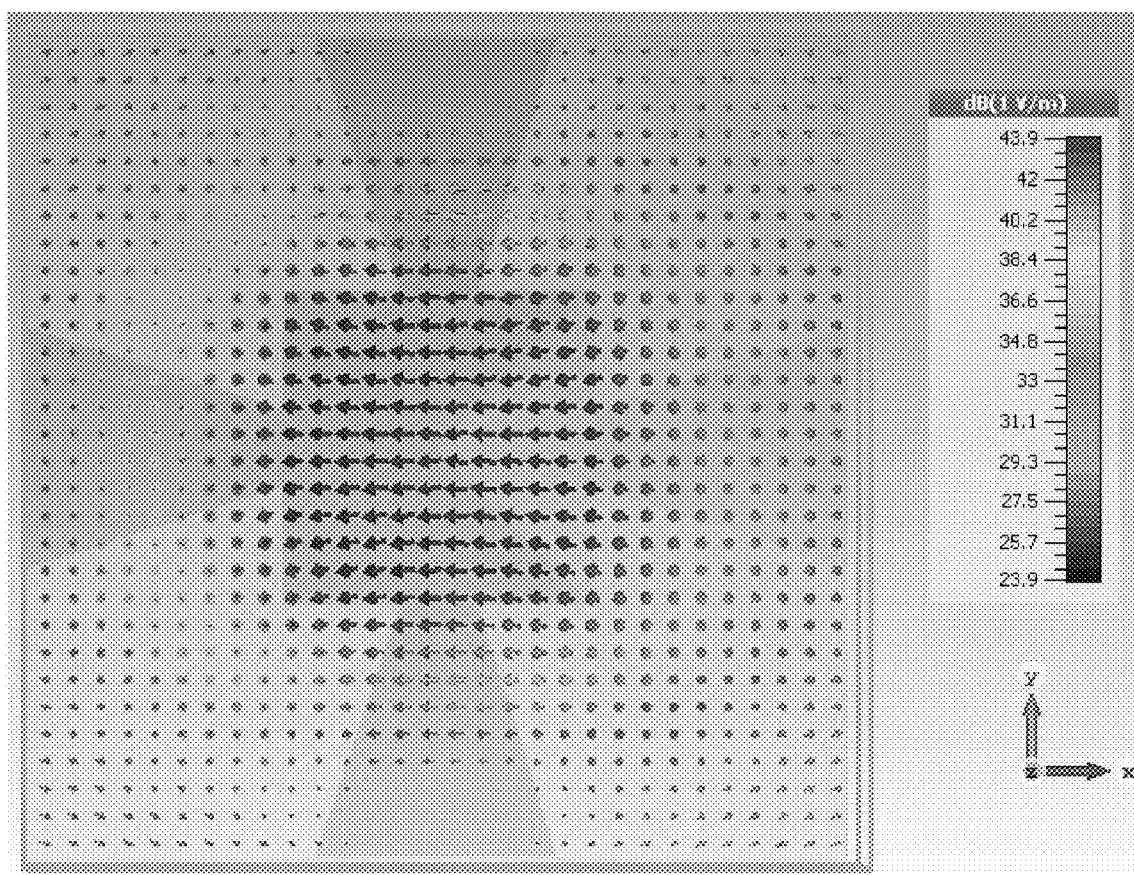
FIG. 6A-F shows simulated E-field vector plots: (A) E-Field normal to the apex at Z=5 mm (0° phase offset between ports 1 and 2 of probe tip); (B) E-Field normal to the apex at Z=6 mm (0° phase offset between ports 1 and 2 of probe tip); (C) E-Field normal to the apex at Z=7 mm (0° phase offset between ports 1 and 2 of probe tip); (D) E-Field normal to the apex at Z=5 mm (90° phase offset between ports 1 and 2 of probe tip); (E) E-Field normal to the apex at Z=6 mm (90° phase offset between ports 1 and 2 of probe tip); and (F) E-Field normal to the apex at Z=7 mm (90° phase offset between ports 1 and 2 of probe tip).
Figure 6B:
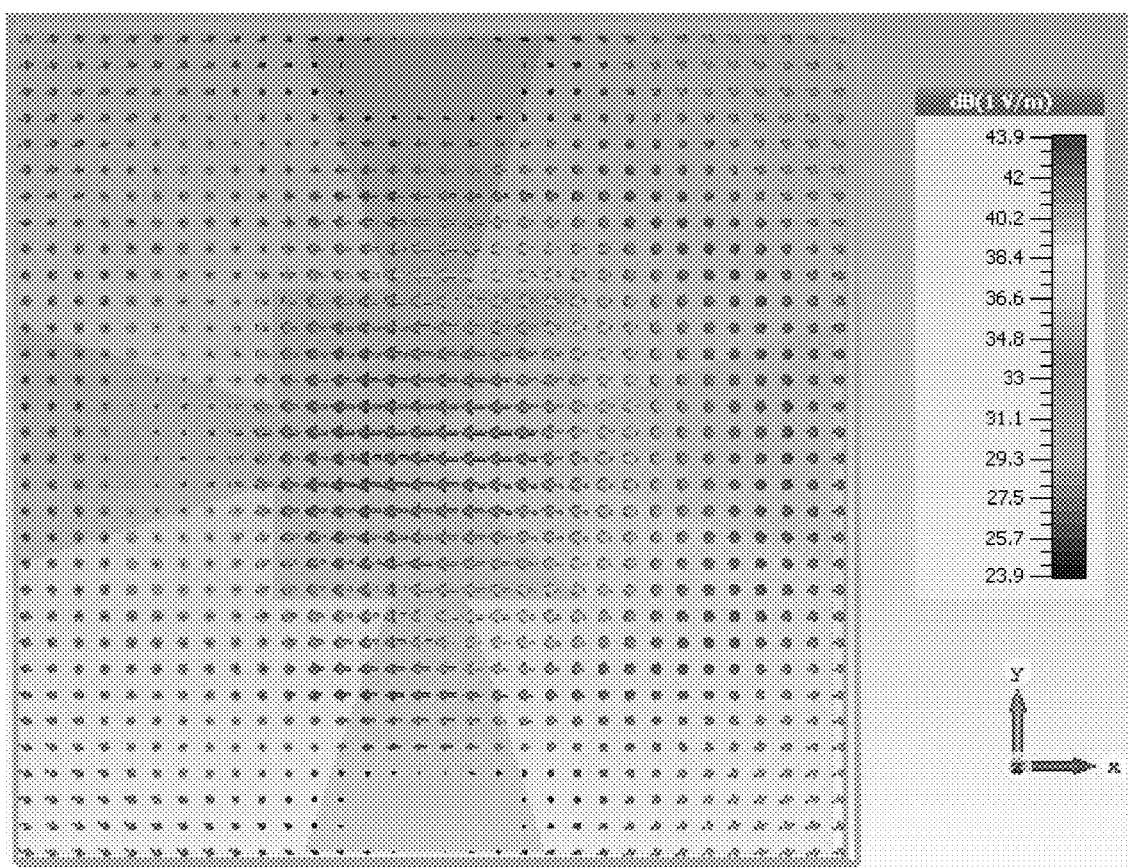
Figure 6C:
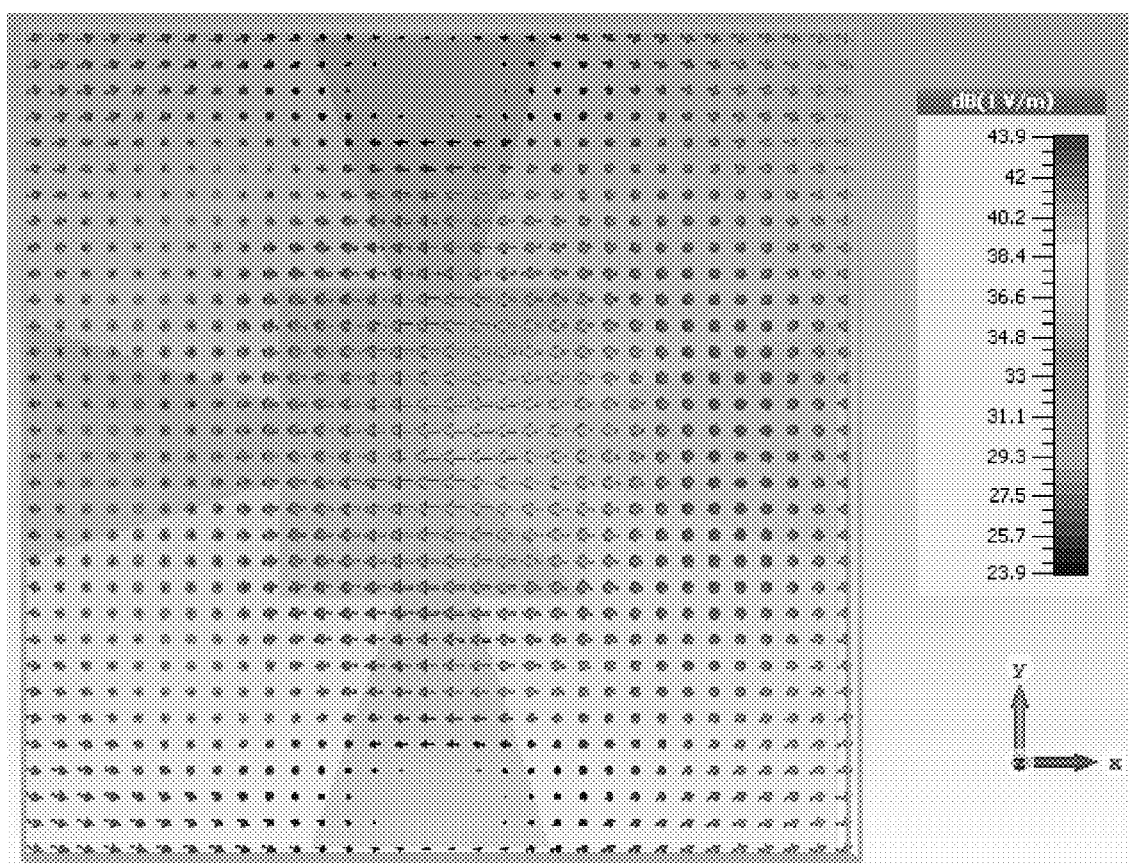
Figure 6D:
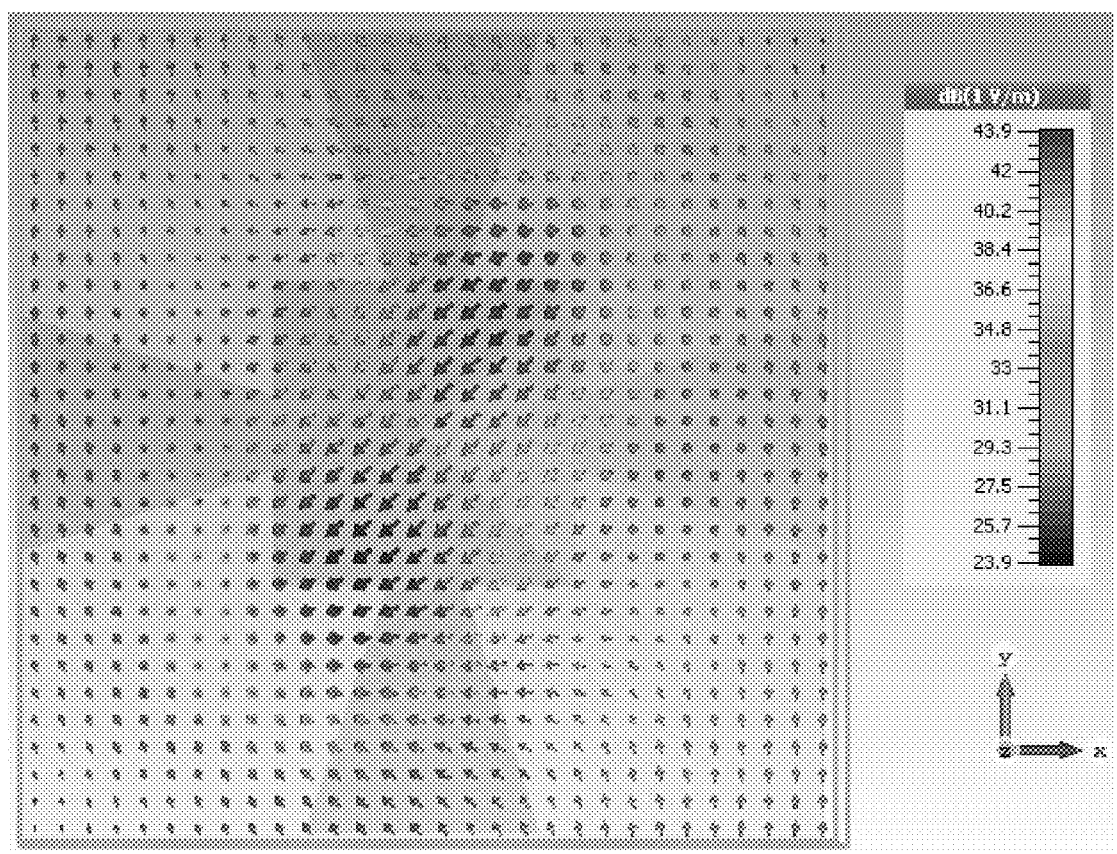
Figure 6E:
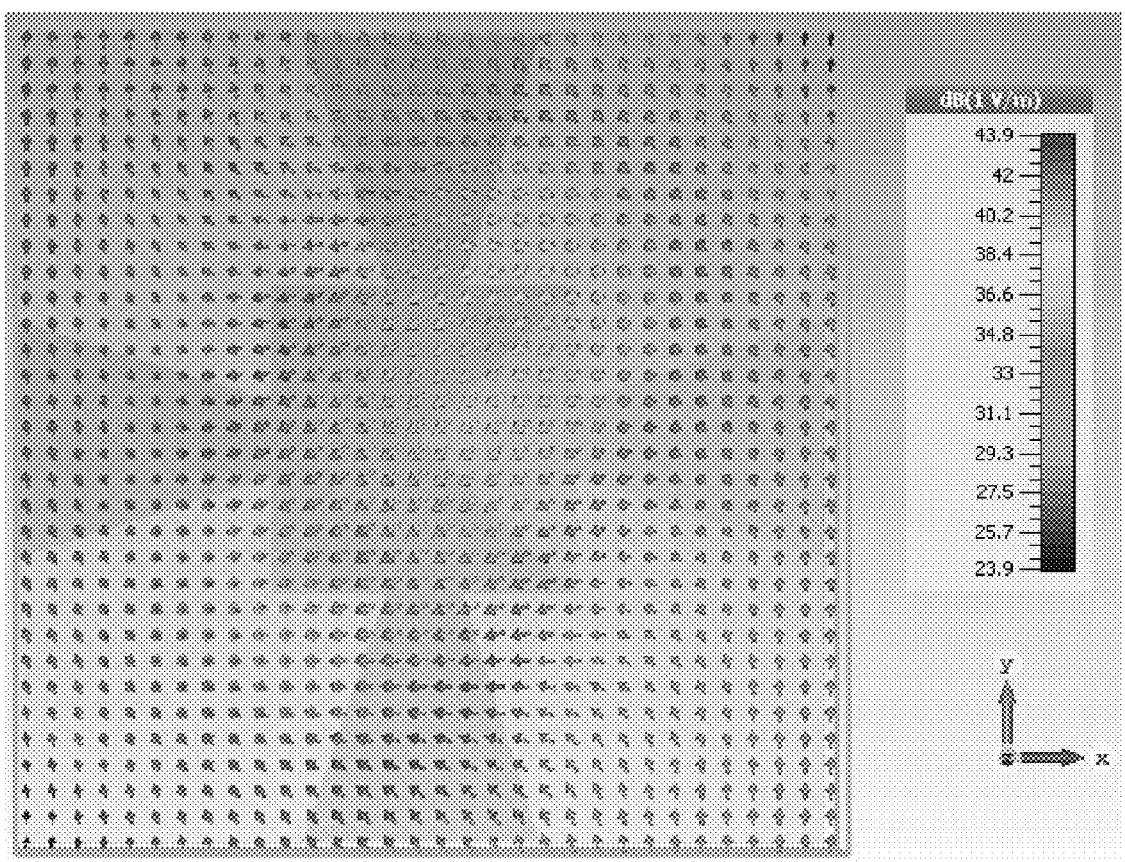
Figure 6F:
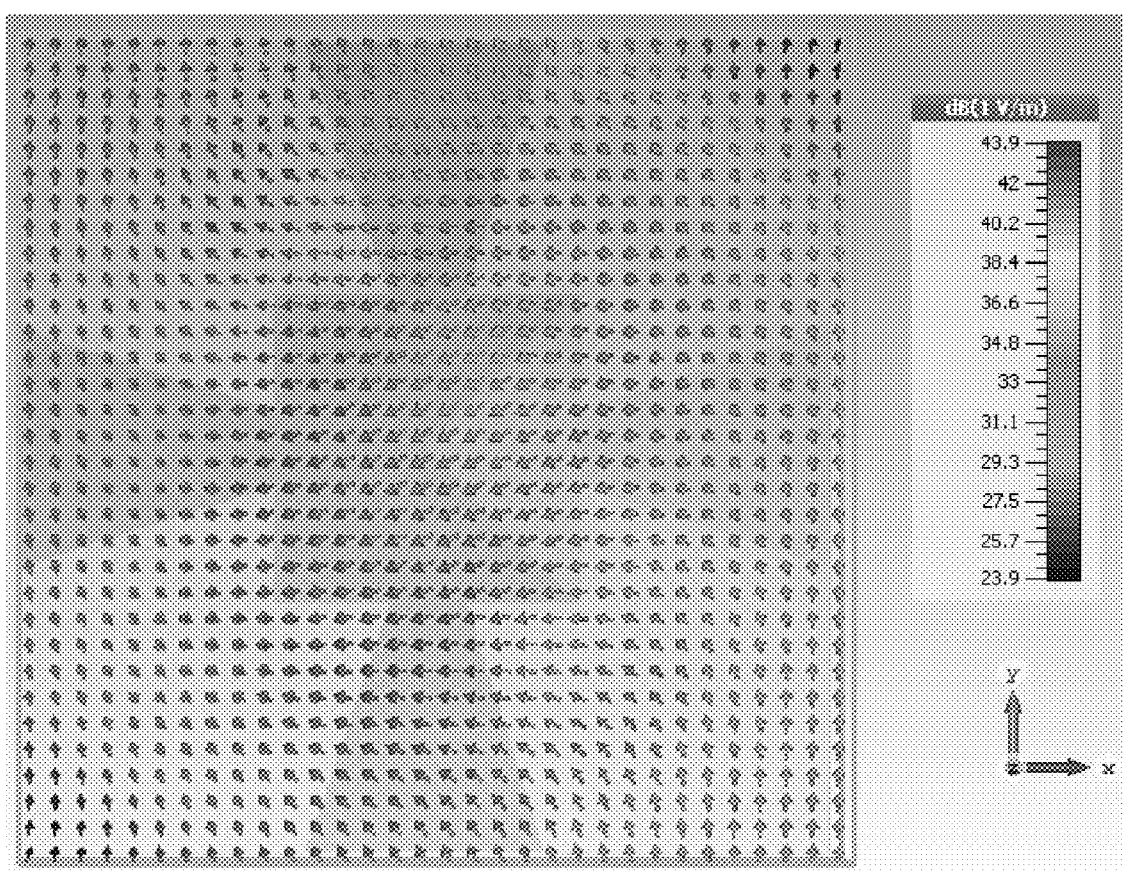
Figure 7A:
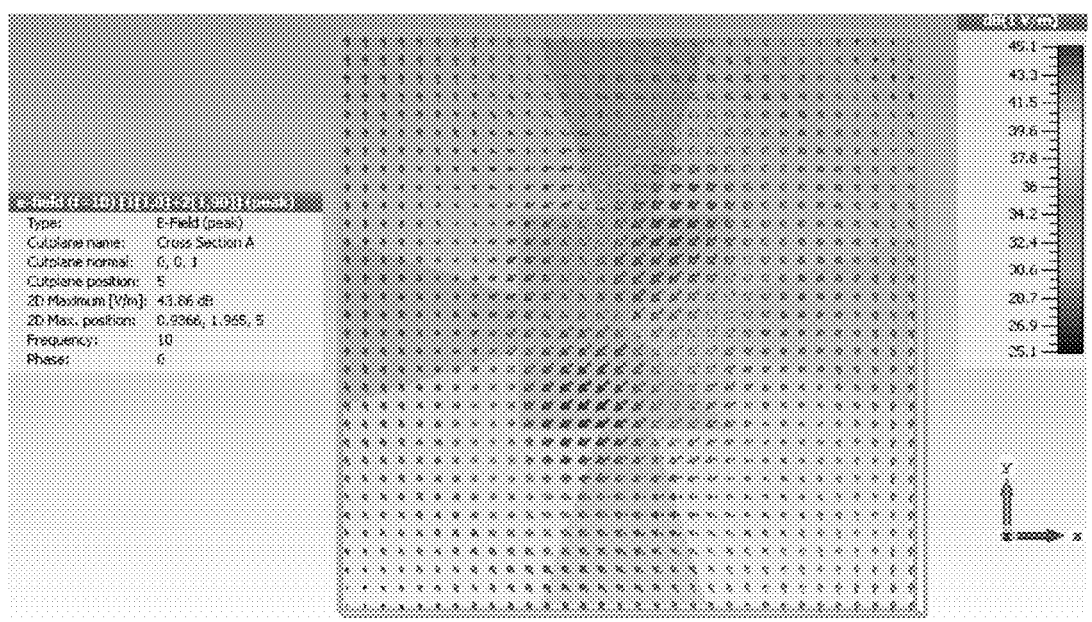
FIG. 7A-D shows simulations of rotating field results: (A) E-Field normal to the apex at Z=5 mm (0° phase offset between ports 1 and 2 of probe tip); (B) E-Field normal to the apex at Z=5 mm (90° phase offset between ports 1 and 2 of probe tip); (C) E-Field normal to the apex at Z=5 mm (180° phase offset between ports 1 and 2 of probe tip); and (D) E-Field normal to the apex at Z=5 mm (270° phase offset between ports 1 and 2 of probe tip).
Figure 7B:
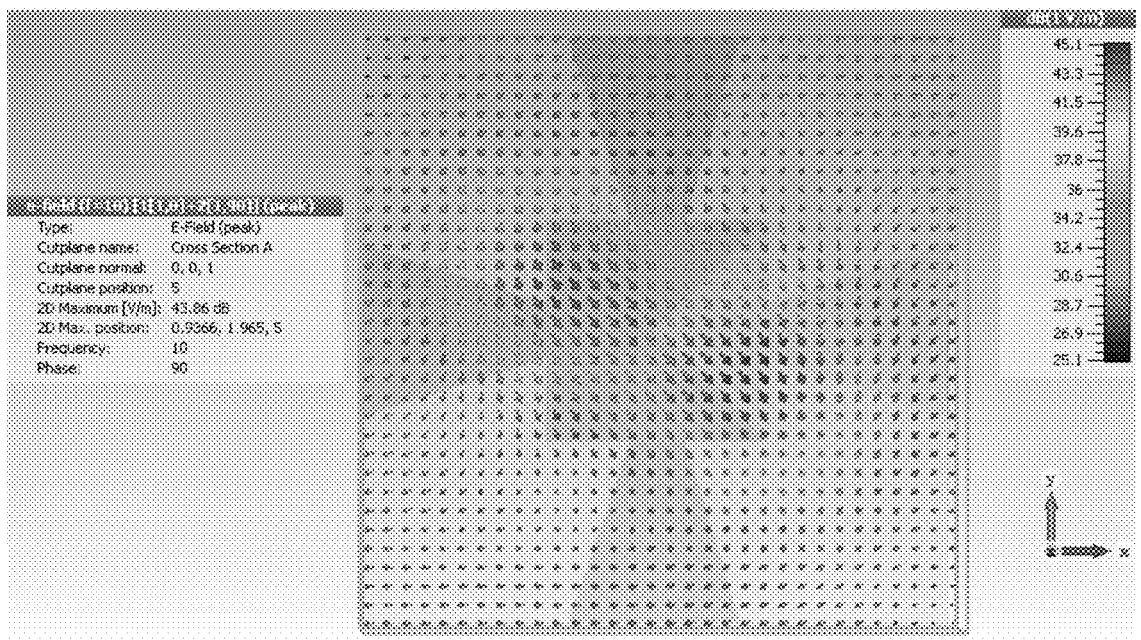
Figure 7C:
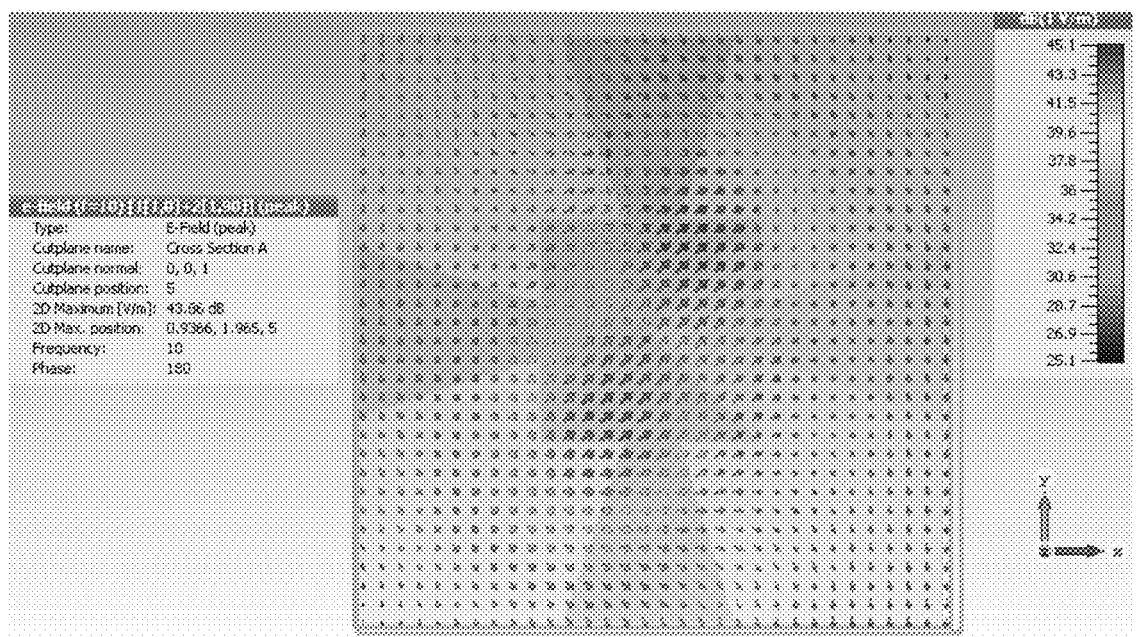
Figure 7D:
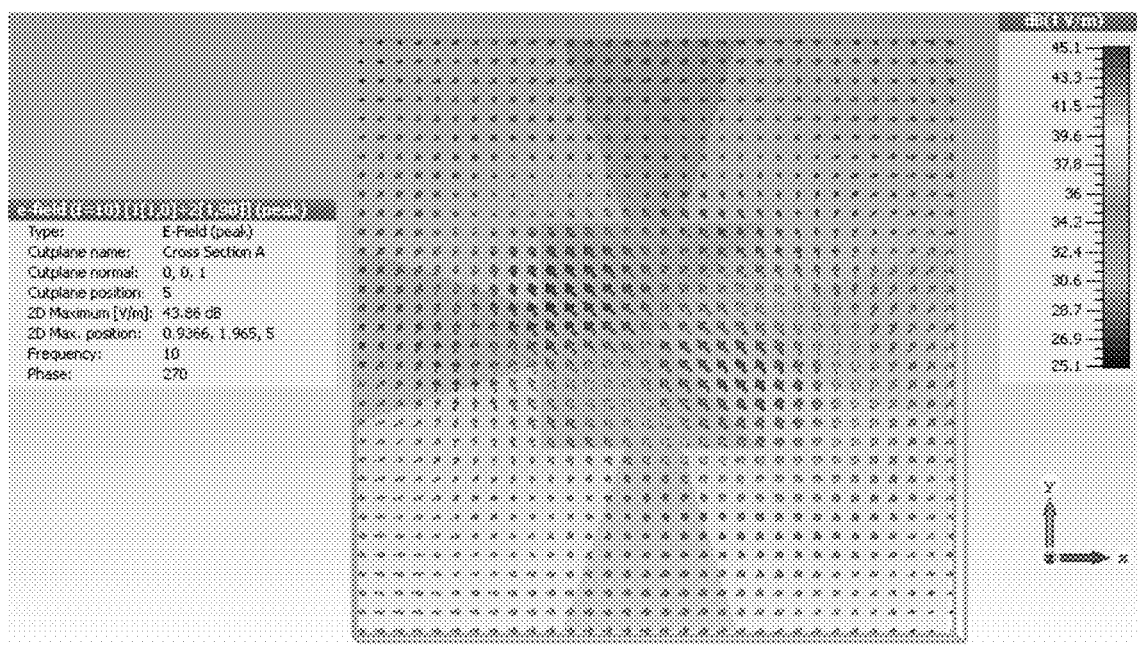
Figure 8A:
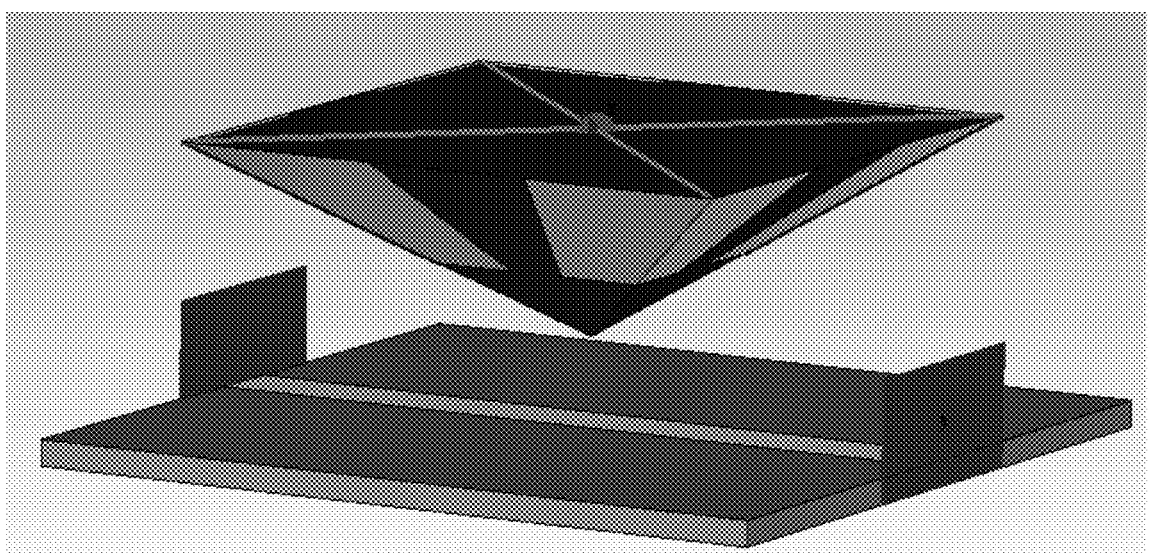
FIG. 8A-C shows an exemplary probe tip with microstrip.
Figure 8B:
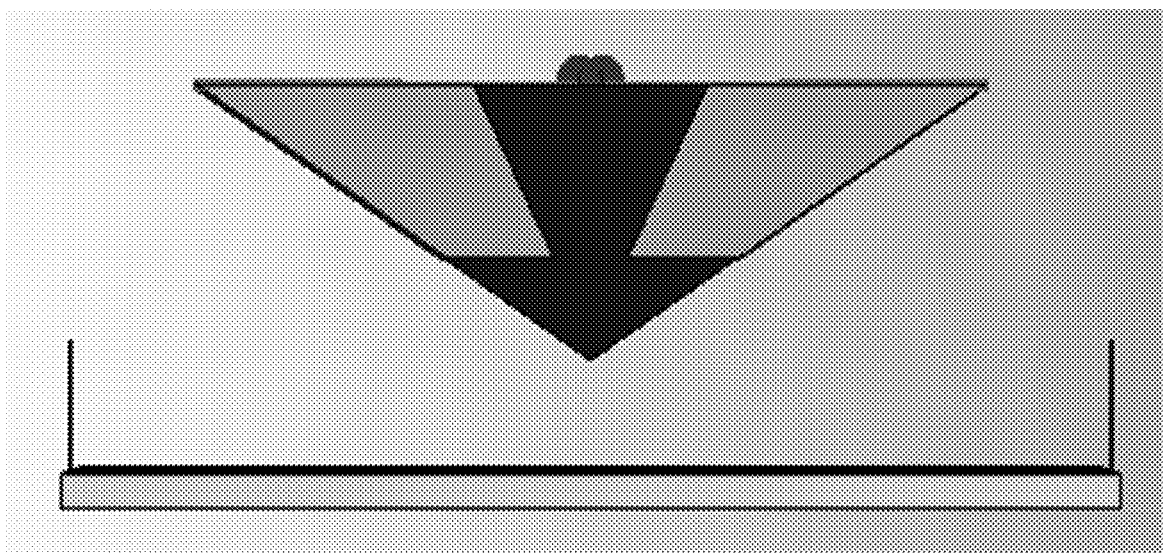
Figure 8C:
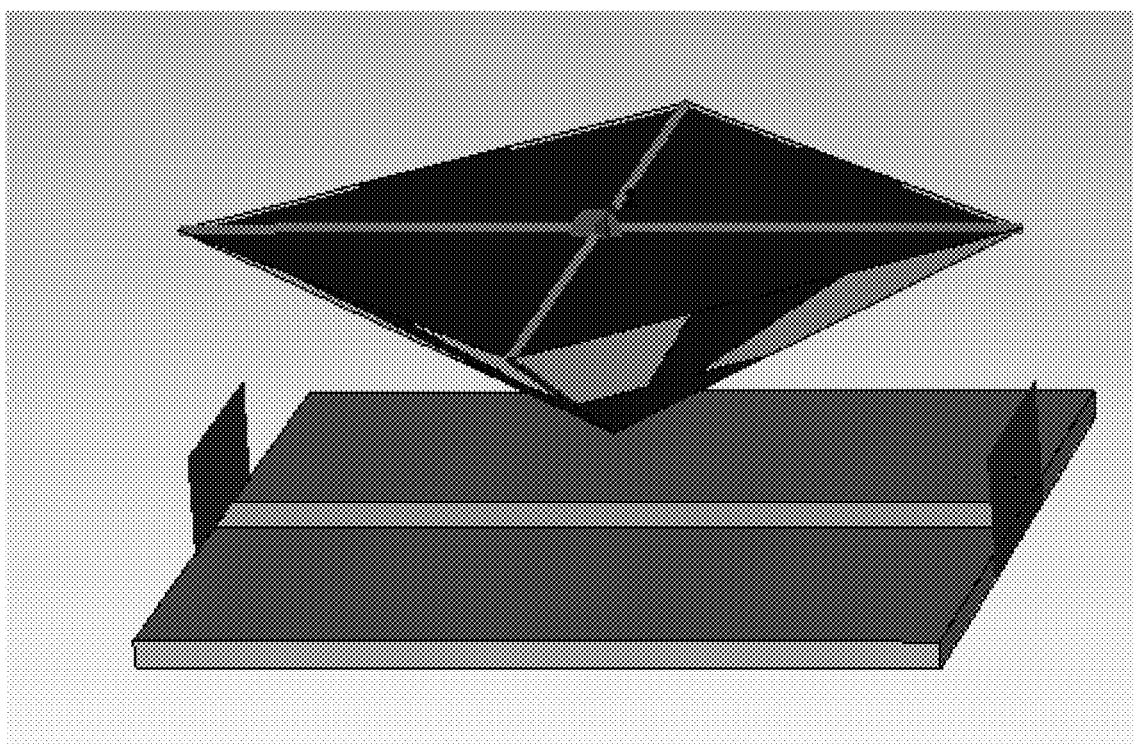
Figure 9:
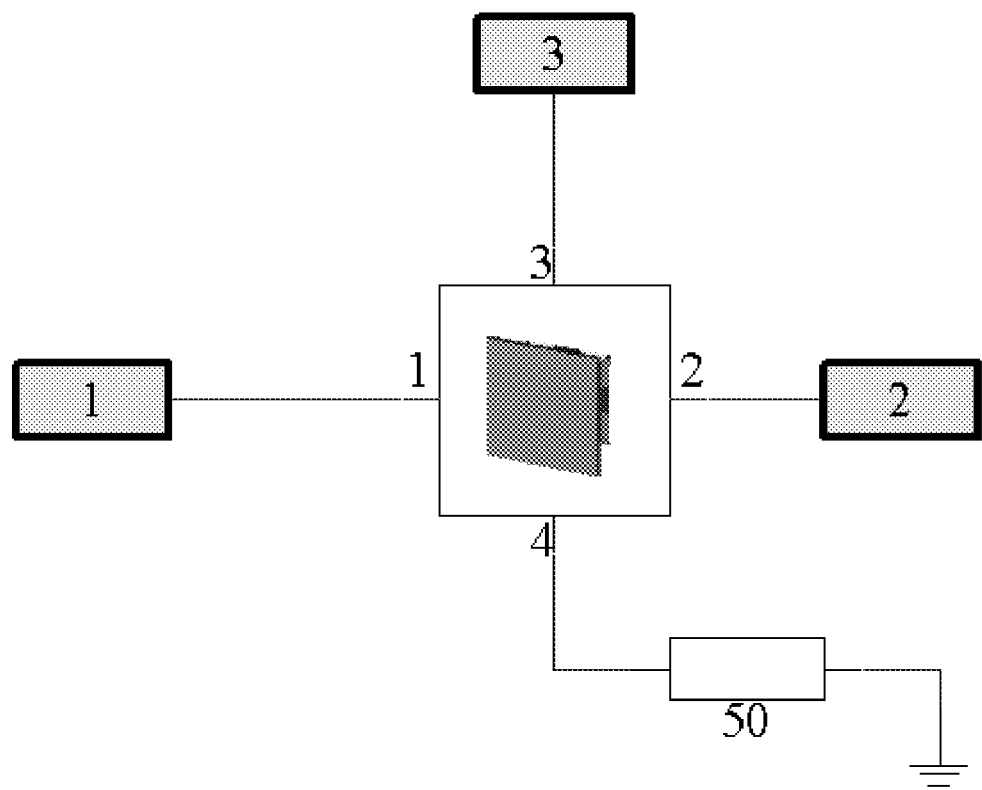
FIG. 9 shows an exemplary simulation set-up.
Figure 10:
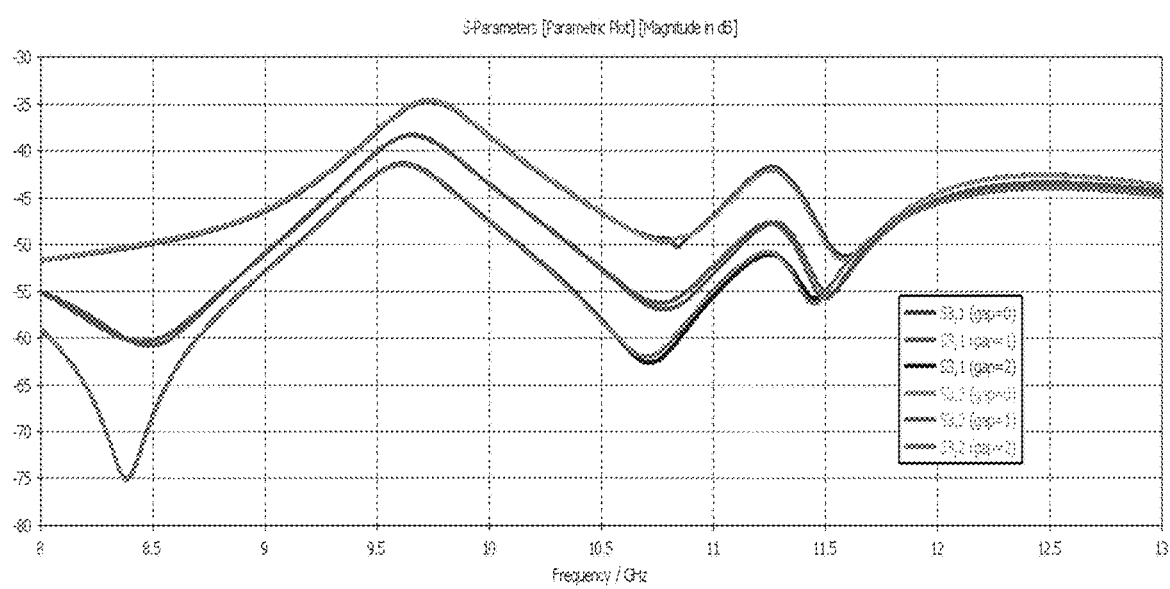
FIG. 10 shows a plot depicting the coupling between two differential ports of the probe tip and the microstrip line whose one end is terminated in 50Ω.
Figure 11:
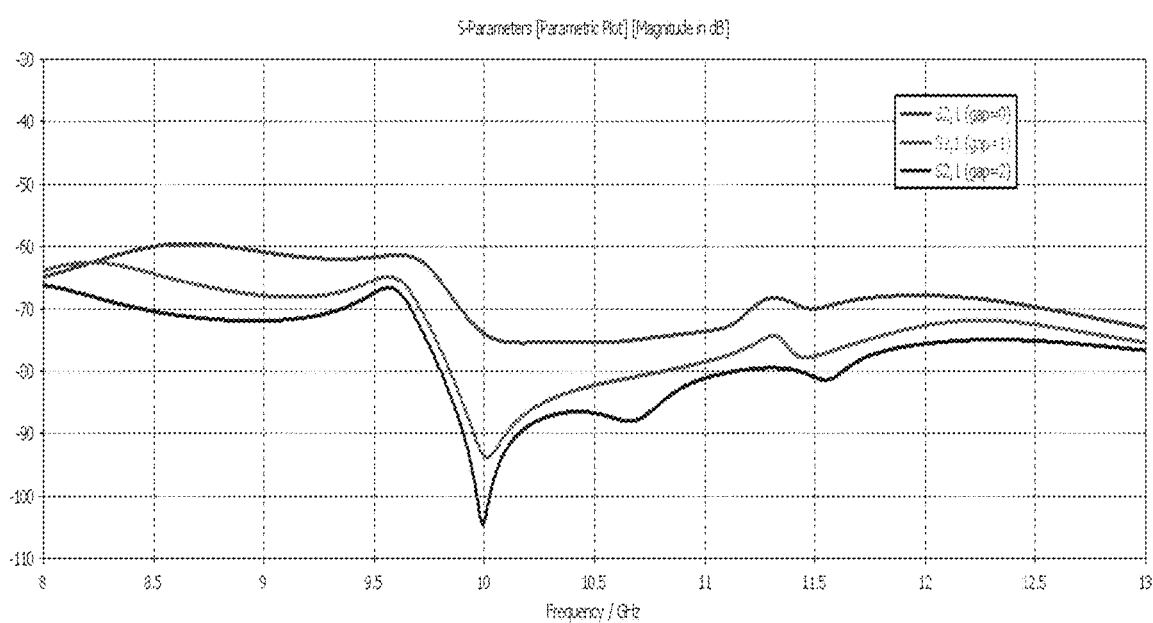
FIG. 11 shows a plot depicting the isolation between two differential ports of the probe tip.
Figure 12:
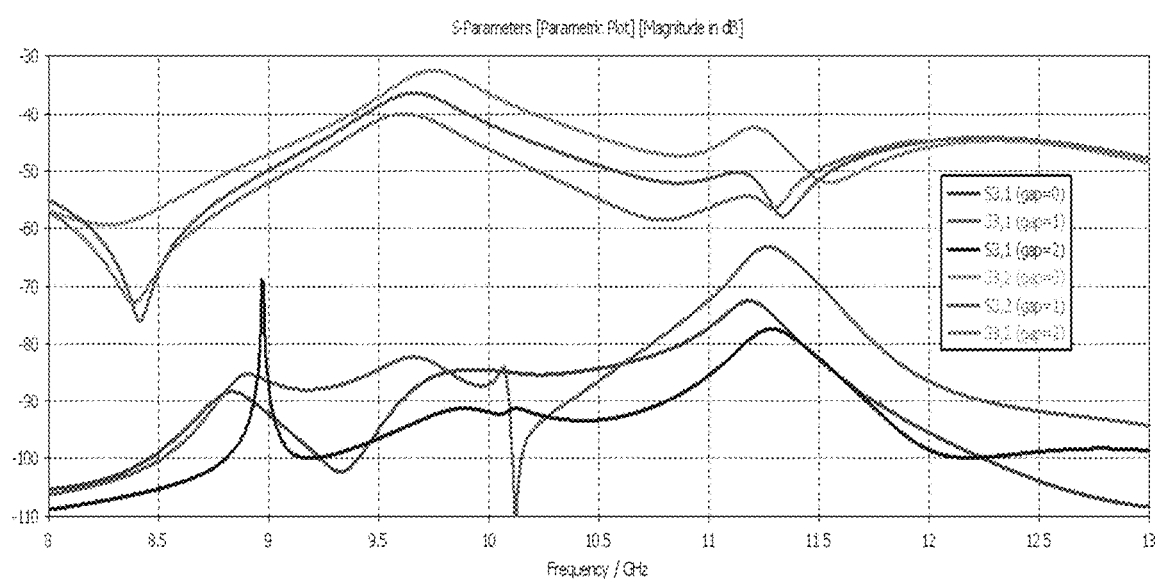
FIG. 12 shows a plot depicting the coupling between two differential ports of the probe tip and the microstrip line whose one end is terminated in 50Ω. Differential port 2 is contributing to the co-pol component with microstrip port 3.
Figure 13:
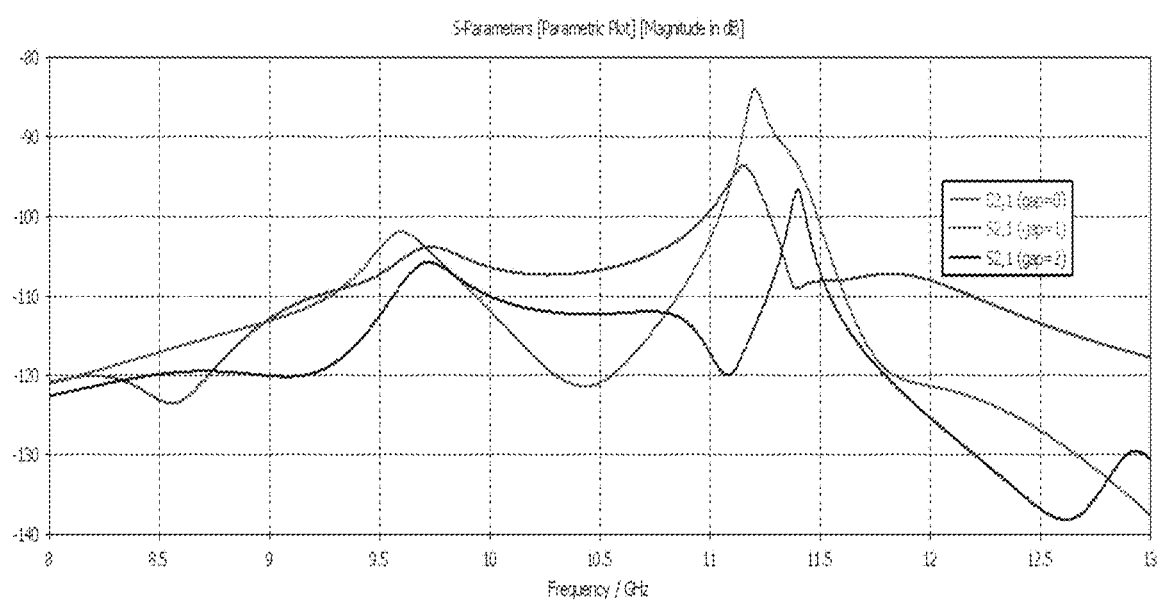
FIG. 13 shows a plot depicting the isolation between two differential ports of the probe tip.
Figure 15:
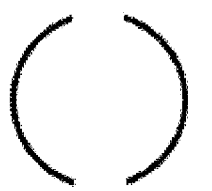
FIG. 15 depicts schematics non-limiting cross-sectional arrangements of electrodes (black) and gaps of exemplary split shields.
Figure 15:
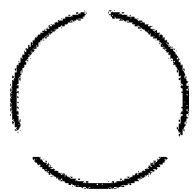
Figure 15:
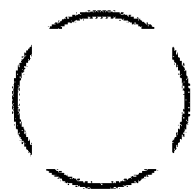
Figure 15:
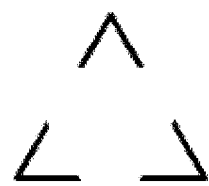
Figure 15:
Figure 15:
Figure 15:
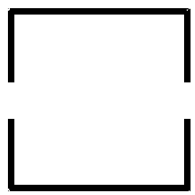
Figure 15:
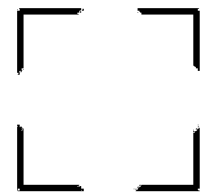
Figure 15:
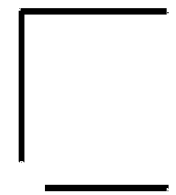
Figure 15:
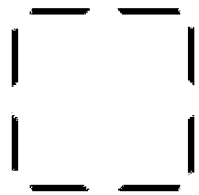
Figure 15:
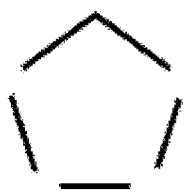
Figure 15:
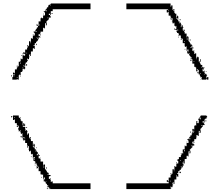
Figure 15:
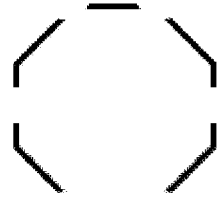
Figure 15:
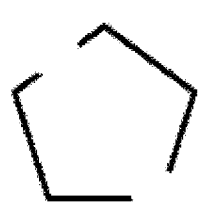
Figure 15:
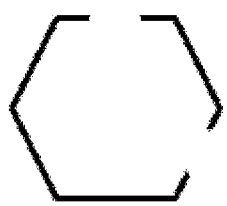

Although any methods and materials similar or equivalent to those described herein can be used in the practice or testing of embodiments described herein, some preferred methods, compositions, devices, and materials are described herein. However, before the present materials and methods are described, it is to be understood that this invention is not limited to the particular molecules, compositions, methodologies or protocols herein described, as these may vary in accordance with routine experimentation and optimization. It is also to be understood that the terminology used in the description is for the purpose of describing the particular versions or embodiments only, and is not intended to limit the scope of the embodiments described herein. Unless otherwise defined, all technical and scientific terms used herein have the same meaning as commonly understood by one of ordinary skill in the art to which this invention belongs. However, in case of conflict, the present specification, including definitions, will control. Accordingly, in the context of the embodiments described herein, the following definitions apply.

As used herein and in the appended claims, the singular forms "a", "an" and "the" include plural reference unless the context clearly dictates otherwise. Thus, for example, reference to "an electrode" is a reference to one or more electrodes and equivalents thereof known to those skilled in the art, and so forth.

As used herein, the term "comprise" and linguistic variations thereof denote the presence of recited feature(s), element(s), method step(s), etc. without the exclusion of the presence of additional feature(s), element(s), method step(s), etc. Conversely, the term "consisting of" and linguistic variations thereof, denotes the presence of recited feature(s), element(s), method step(s), etc. and excludes any unrecited feature(s), element(s), method step(s), etc., except for ordinarily-associated impurities. The phrase "consisting essentially of" denotes the recited feature(s), element(s), method step(s), etc. and any additional feature(s), element(s), method step(s), etc. that do not materially affect the basic nature of the composition, system, or method. Many embodiments herein are described using open "comprising" language. Such embodiments encompass multiple closed "consisting of" and/or "consisting essentially of" embodiments, which may alternatively be claimed or described using such language.

As used herein, the term "dielectric" or "dielectric material" refers to is an electrical insulator or insulating material that can be polarized by an applied electric field. When a "dielectric" is placed in an electric field, electric charges do not flow through the material as they do in a conductor. Rather, the charge is slightly shifted from the average equilibrium, causing dielectric polarization.

As used herein, the term "conductor" or "conductive material" refers to an electrical conductor of electric-conductive material, a material that readily permits the flow of electric charges there through.

As used herein, the term "longitudinal axis" refers to an axis that passes through the center of the longest dimension of an object (e.g., extends lengthwise through the center of a device described herein).

As used herein, the term "radial symmetry" refers to the arrangement of elements about a central axis, such that the elements can be divided into equal parts (e.g., halves (two-part symmetry), thirds (three-part symmetry), quarters (four-part symmetry), fifths (five-part symmetry), sixths (six-part symmetry), etc.).

DETAILED DESCRIPTION

Provided herein are electric and magnetic field probes for measuring and mapping distributions of such fields on, for example, circuits, antennas and materials.

Provided herein are electric and magnetic field probes and methods of excitation (or by reciprocity, detection) to spatially resolve orthogonal electric and magnetic fields, particularly at sub-millimeter dimensions and high frequencies. In some embodiments, as described and depicted herein the principle of reciprocity allows a user freely choose to excite or detect field components with no loss of generality.

In some embodiments, provided herein is a coaxial transmission line terminated in an open circuit, having a split shield or outer conductor (e.g., a shield or outer conductor with a cross-section that incompletely encloses the dielectric and/or inner conductor or core). In some embodiments, the gap(s) in the shield are used to sense an orthogonal field (or a field existing in that gap).

A preferred embodiment of the probe is substantially pyramidal, and may be, for example, mounted onto a cantilever for scanning in a scanning force microscope, such as the system described in "Combined topography and electromagnetic field scanning probe microscope" U.S. Pat. No. 5,936,237, incorporated by reference herein. The probe may also be mounted at the distal end of a multi-conductor transmission line.

As shown in the figures, the in-plane fields can be generated and/or detected with appropriate phasing of two signal sources, or equivalently, two channels of a synchronous receiver. The out-of-plane field component is generated or detected conventionally by the coaxial probe tip along the central axis of the pyramid.

In some embodiments, a device herein comprises a coaxial transmission line comprising an incomplete outer conductive layer, in which at least one gap in the outer conductor extends the longitudinally along the length of the line. In some embodiments, the gap(s) allows the device to be used to sense and orthogonal electromagnetic field (e.g., a field existing within the gap). In some embodiments, the orthogonal field component between the electrodes (e.g. residing within the gap) is sensed.

In some embodiments, a split shield comprises one or more gaps (e.g., 1, 2, 3, 4, 5, 6, 7, 8, 9, 10, 11, 12, or more, or ranges therebetween). In some embodiments, each gap allow for sensing of a filed in a different orientation with respect to the longitudinal axis of the device. In some embodiments, multiple gaps on a probe allows for sensing of multiple fields or field orientations. In some embodiments, rotation (e.g., mechanical rotation) of a device around the longitudinal axis allows sensing of multiple fields by a single gap.

In some embodiments, gaps prevent any contact between the electrodes. In some embodiments, the dielectric space prevents any contact between electrodes and the core conductor. In some embodiments, air separates electrodes and/or the core. In some embodiments, a dielectric material separates electrodes and/or the core. In some embodiments, air and one or more other dielectric materials separate the electrodes and/or the core.

Figure 16:
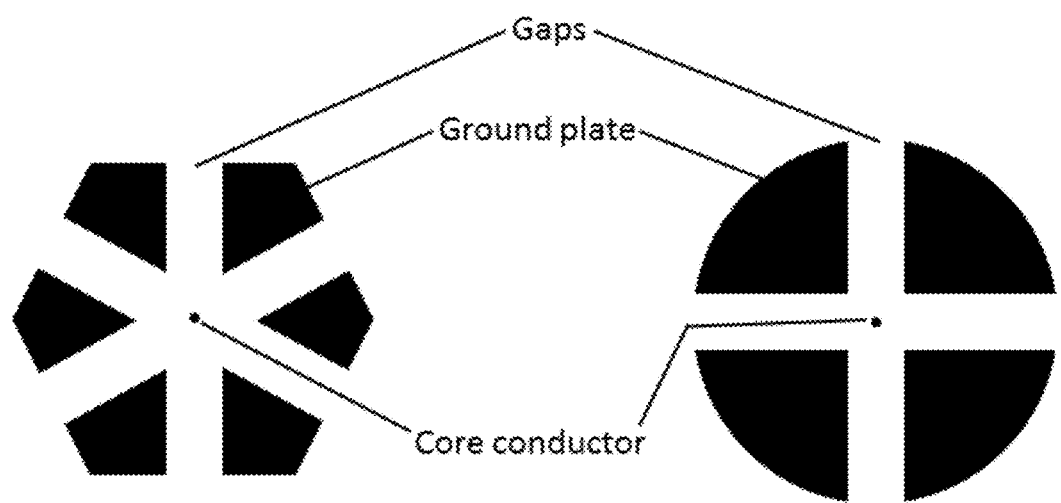
FIG. 16 depicts top (above) and cutaway side (below) schematic views of exemplary devices comprising distal-end ground plates. The gaps of the split shield extend into the ground plate.
Figure 16:
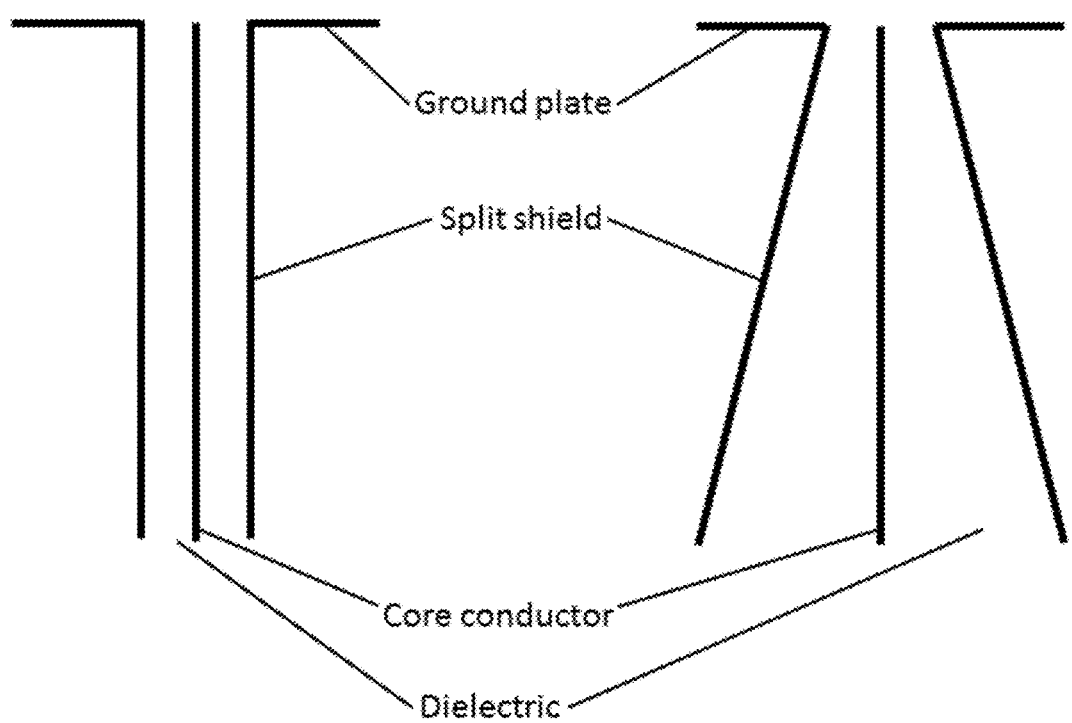

In some embodiments, a device comprises a ground plate (See, e.g., FIG. 16) on the distal end (e.g., open circuit end) of the device. In some embodiments, the ground plate is a flare, extension, or enlargement of the split shield of the coaxial line. In some embodiments, the gaps within the split shield extend into the ground plate. In some embodiments, extension of the gaps into the ground plate produces a "floral" pattern. In some embodiments, the surface of the ground plate is perpendicular to the longitudinal axis of the transmission line. In some embodiments, the surface of the ground plate is at a 30-90° (e.g., 30°, 40°, 50°, 60°, 70°, 80°, 90°, or ranges therebetween) angle (e.g., 90° being perpendicular to) relative to the longitudinal axis of the transmission line. In some embodiments, the ground plate (and the gaps therein) allow the devoice to sense electromagnetic fields oriented at an angle offset to the transmission line. In some embodiments, a ground plate is orthogonal to the longitudinal axis of the transmission line, allowing a device to sense in-plane fields when the ground plate is placed parallel to the surface of a sample. In some embodiments, the diameter or largest distance across the ground plate is greater than the diameter or largest distance across the distal end of the split shield. In some embodiments, the diameter or largest distance across the ground plate is greater than the widest diameter or largest distance across the split shield (e.g., the proximal end of the split shield). In some embodiments, the diameter or largest distance across the ground plate is greater than the diameter or largest distance across the distal end of the split shield, but less than the diameter or largest distance across the proximal end of the split shield (e.g., in a tapered coaxial). In some embodiments, a ground plate and split shield allow for field sensing in the x-, y-, and z-dimensions relative to the device or a sample.

Some embodiments herein find use with systems, components, materials, applications, etc. known in the field, for example, those described in U.S. Pat. No. 8,266,718 and WO 2006/017249; herein incorporated by reference in their entireties.

In some embodiments, devices and components described herein are scalable relative to the dimensions of the field and/or sample to be sensed.

Exemplary dielectric materials include polymers or plastics, such as TEFLON, polypropylene, polyethylene, etc.; materials, such as glass, epoxy, porcelain (ceramic), mica, polyimide, etc.; dielectric alloys, such as alumina, magnesium titanate, barium titanate; and gases, such as argon, nitrogen, air, etc. Other dielectric materials known in the field and/or combinations of dielectric materials also find use in embodiments herein.

Exemplary conductive materials for the core and/or electrodes (of the split shield) include copper, silver, gold, platinum, aluminum, palladium, cadmium, lithium fluoride, molybdenum oxide, and other conductive metals, alloys, etc. Other conductive materials known in the field and/or combinations of conductive materials also find use in embodiments herein.

The invention claimed is:

1. A device comprising a coaxial transmission line, the coaxial transmission line comprising:
   (a) a core conductor forming a longitudinal axis of the coaxial transmission line;
   (b) a split shield comprising two or more electrodes disposed about the longitudinal axis with gaps separating the electrodes from one another; and
   (c) a dielectric insulator separating the split shield from the core conductor.

2. The device of claim 1, wherein a distal end of the coaxial transmission line terminates in an open circuit.

3. The device of claim 1, wherein a distal end of the coaxial transmission line terminates in a ground plate that extends beyond the outer edge of the distal end of the split shield, and wherein the gaps of the split shield extend into and through the ground plate.

4. The device of claim 1, wherein the coaxial transmission line is a semi-rigid coaxial transmission line.

5. The device of claim 1, wherein the split shield is parallel to the longitudinal axis.

6. The device of claim 1, wherein the split shield is tapered from a proximal end to a distal end about the longitudinal axis.

7. The device of claim 1, wherein the taper angle between the split shield and the longitudinal axis is greater than 0° (parallel to the longitudinal axis) and less than 90° (perpendicular to the longitudinal axis).

8. The device of claim 1, comprising 2-12 electrodes and gaps.

9. The device of claim 1, wherein the split shield comprises a circular cross-section around the longitudinal axis.

10. The device of claim 1, wherein the split shield comprises a polygonal cross-section around the longitudinal axis.

11. The device of claim 10, wherein the split shield comprises a polygonal cross-section comprises 3-12 sides.

12. The device of claim 11, wherein the electrodes are disposed on sides of the polygonal cross-section with corners of the polygon occurring in the gaps.

13. The device of claim 11, wherein the electrodes are disposed on corners of the polygonal cross-section with gaps occurring in sides of the polygon.

14. The device of claim 1, wherein the electrodes are disposed equidistantly from the longitudinal axis.

15. The device of claim 1, wherein the electrodes are disposed symmetrically around the longitudinal axis.

16. The device of claim 1, wherein the gaps are 1 µm to 10 mm in width.

17. The device of claim 16, wherein all of the gaps are or equal width.

18. The device of claim 17, wherein the gaps are 50% the width of the width of the electrodes, or less.

19. A method for measuring and/or mapping distributions electric and/or magnetic fields comprising employing a device of claim 1.

20. A device comprising a coaxial transmission line having a proximal end, a distal end and a longitudinal axis, comprising:
   (a) a core conductor forming the longitudinal axis of the coaxial transmission line;
   (b) a split shield, tapered from the proximal end to the distal end about the longitudinal axis, with a cross-sectional geometry centered upon the longitudinal axis, and comprising two or more electrodes disposed about the longitudinal axis with gaps separating the electrodes from one another; and
   (c) a dielectric insulator separating the split shield from the core conductor;
wherein a distal end of the coaxial transmission line terminates in an open circuit.

* * * * *

UNITED STATES PATENT AND TRADEMARK OFFICE
CERTIFICATE OF CORRECTION

PATENT NO. : 10,401,389 B2
APPLICATION NO. : 15/423191
DATED : September 3, 2019
INVENTOR(S) : Daniel Warren Van Der Weide It is certified that error appears in the above-identified patent and that said Letters Patent is hereby corrected as shown below:

In the Claims

Column 8, Claim 17, Line 30 should read:
– The device of claim 16, wherein all of the gaps are of –

Signed and Sealed this
Thirteenth Day of December, 2022

Katherine Kelly Vidal
*Director of the United States Patent and Trademark Office*